United States Patent
Kato et al.

(10) Patent No.: US 7,459,726 B2
(45) Date of Patent: Dec. 2, 2008

(54) SEMICONDUCTOR DEVICE COMPRISING A LIGHT EMITTING ELEMENT AND A LIGHT RECEIVING ELEMENT

(75) Inventors: Kiyoshi Kato, Kanagawa (JP); Toru Takayama, Kanagawa (JP); Junya Maruyama, Kanagawa (JP); Yuugo Goto, Kanagawa (JP); Yumiko Ohno, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 117 days.

(21) Appl. No.: 10/775,328

(22) Filed: Feb. 11, 2004

(65) Prior Publication Data

US 2004/0195572 A1 Oct. 7, 2004

(30) Foreign Application Priority Data

Feb. 12, 2003 (JP) ............................. 2003-033833

(51) Int. Cl.
*H01L 31/12* (2006.01)

(52) U.S. Cl. ................. 257/82; 257/290; 257/E31.096; 438/24; 438/69

(58) Field of Classification Search ................. 257/83, 257/290, E31.096, 82; 438/155, 69, 24, 31; 398/156, 138

See application file for complete search history.

(56) References Cited

U.S. PATENT DOCUMENTS

| | | | | |
|---|---|---|---|---|
| 3,348,056 A | * | 10/1967 | Kohashi | 250/214 LA |
| 3,976,877 A | * | 8/1976 | Thillays | 250/551 |
| 4,058,821 A | * | 11/1977 | Miyoshi et al. | 257/82 |
| 4,612,083 A | * | 9/1986 | Yasumoto et al. | 438/59 |
| 4,766,471 A | * | 8/1988 | Ovshinsky et al. | 257/53 |
| 4,811,210 A | | 3/1989 | McAulay | |
| 4,823,178 A | | 4/1989 | Suda | |
| 4,830,444 A | | 5/1989 | Cloonan et al. | |

(Continued)

FOREIGN PATENT DOCUMENTS

CN 1291792 4/2001

(Continued)

OTHER PUBLICATIONS

Partial European Search Report dated Apr. 8, 2004 for Application No. 03009851.1.

(Continued)

*Primary Examiner*—Douglas M. Menz
*Assistant Examiner*—Steven J. Fulk
(74) *Attorney, Agent, or Firm*—Eric J. Robinson; Robinson Intellectual Property Law Office, P.C.

(57) ABSTRACT

A semiconductor device which has a high performance integrated circuit formed of an inexpensive glass substrate and capable of processing a large amount of information and operating at higher data rates. The semiconductor device includes semiconductor elements stacked by transferring a semiconductor element formed on a different substrate. A resin film is formed between the stacked semiconductor elements and a metal oxide film is partially formed between the stacked semiconductor elements as well. A first electric signal is converted to an optical signal in a light emitting element electrically connected to one of the stacked semiconductor elements. Meanwhile, the optical signal is converted to a second electric signal in a light receiving element electrically connected to another one of the stacked semiconductor elements.

23 Claims, 14 Drawing Sheets

U.S. PATENT DOCUMENTS

| | | | |
|---|---|---|---|
| 4,843,587 A | | 6/1989 | Schlunt et al. |
| 4,851,695 A | * | 7/1989 | Stein .................... 250/551 |
| 4,888,625 A | * | 12/1989 | Mueller .................... 257/80 |
| 4,894,699 A | * | 1/1990 | Hayashi et al. ........... 257/435 |
| 4,988,891 A | | 1/1991 | Mashiko |
| 5,008,554 A | | 4/1991 | Asakawa et al. |
| 5,095,380 A | | 3/1992 | Kawai |
| 5,200,631 A | | 4/1993 | Austin et al. |
| 5,249,245 A | * | 9/1993 | Lebby et al. ................ 385/89 |
| 5,262,980 A | | 11/1993 | Shannon |
| 5,266,794 A | | 11/1993 | Olbright et al. |
| 5,268,679 A | | 12/1993 | Shannon |
| 5,291,324 A | | 3/1994 | Hinterlong |
| 5,297,232 A | | 3/1994 | Murphy |
| 5,339,090 A | | 8/1994 | Crossland et al. |
| 5,353,247 A | | 10/1994 | Faris |
| 5,357,122 A | | 10/1994 | Okubora et al. |
| 5,362,961 A | | 11/1994 | Hamanaka |
| 5,383,042 A | | 1/1995 | Robinson |
| 5,410,502 A | | 4/1995 | Bird |
| 5,478,658 A | | 12/1995 | Dodabalapur et al. |
| 5,483,263 A | | 1/1996 | Bird et al. |
| 5,488,735 A | | 1/1996 | Tanabe et al. |
| 5,491,571 A | | 2/1996 | Williams et al. |
| 5,502,837 A | | 3/1996 | Hoffert |
| 5,523,704 A | | 6/1996 | So |
| 5,546,209 A | | 8/1996 | Willner et al. |
| 5,583,570 A | | 12/1996 | Yamada |
| 5,654,559 A | * | 8/1997 | Spaeth et al. ................. 257/82 |
| 5,705,829 A | | 1/1998 | Miyanaga et al. |
| 5,738,731 A | | 4/1998 | Shindo et al. |
| 5,832,147 A | | 11/1998 | Yeh et al. |
| 5,848,214 A | * | 12/1998 | Haas et al. ................ 385/120 |
| 6,111,902 A | | 8/2000 | Kozlov et al. |
| 6,140,165 A | | 10/2000 | Zhang et al. |
| 6,160,828 A | | 12/2000 | Kozlov et al. |
| 6,627,518 B1 | | 9/2003 | Inoue et al. |
| 6,627,953 B1 | * | 9/2003 | Vu et al. .................... 257/347 |
| 6,661,940 B2 | | 12/2003 | Kim |
| 6,730,933 B1 | | 5/2004 | Shimizu et al. |
| 6,878,607 B2 | | 4/2005 | Inoue et al. |
| 7,079,776 B1 | * | 7/2006 | Shimoda et al. ........... 398/140 |
| 2001/0006503 A1 | | 7/2001 | Braitberg et al. |
| 2002/0009274 A1 | | 1/2002 | Gharavla |
| 2002/0027206 A1 | * | 3/2002 | Yuan et al. ................ 250/551 |
| 2002/0158263 A1 | | 10/2002 | Tanaka et al. |
| 2002/0159487 A1 | | 10/2002 | Thornton et al. |
| 2003/0002826 A1 | | 1/2003 | Cohen et al. |
| 2003/0032210 A1 | | 2/2003 | Takayama et al. |
| 2003/0122137 A1 | | 7/2003 | Hashimoto |
| 2003/0139520 A1 | | 7/2003 | Toyama et al. |
| 2003/0162312 A1 | | 8/2003 | Takayama et al. |
| 2003/0218174 A1 | | 11/2003 | Verdonk et al. |
| 2003/0218418 A9 | | 11/2003 | Sato et al. |
| 2004/0007706 A1 | | 1/2004 | Yamazaki |
| 2004/0012016 A1 | | 1/2004 | Underwood et al. |
| 2004/0042707 A1 | | 3/2004 | Imai et al. |
| 2004/0061126 A1 | | 4/2004 | Imai et al. |
| 2004/0195572 A1 | | 10/2004 | Kato et al. |
| 2005/0006648 A1 | | 1/2005 | Yamazaki et al. |
| 2005/0012445 A1 | | 1/2005 | Yamazaki et al. |
| 2005/0048320 A1 | | 3/2005 | Kobayashi |
| 2006/0082627 A9 | | 4/2006 | Bright et al. |
| 2006/0180826 A1 | | 8/2006 | Yamazaki et al. |
| 2007/0029548 A1 | | 2/2007 | Yamazaki et al. |

FOREIGN PATENT DOCUMENTS

| | | | |
|---|---|---|---|
| DE | 199 63 165 | | 3/2001 |
| EP | 0 633 542 | | 1/1995 |
| EP | 0683623 | | 11/1995 |
| EP | 1 093 166 | | 4/2001 |
| EP | 1154676 | | 11/2001 |
| EP | 1 281 690 | | 2/2003 |
| JP | 05-037357 | | 2/1993 |
| JP | 05-343183 | | 12/1993 |
| JP | 09-246509 | | 9/1997 |
| JP | 10-063807 | | 3/1998 |
| JP | 11-243209 | | 9/1999 |
| JP | 2000-058259 | | 2/2000 |
| JP | 2000-058882 | | 2/2000 |
| JP | 2000-277794 | | 10/2000 |
| JP | 2001-189460 | | 7/2001 |
| JP | 3397565 | | 4/2003 |
| JP | 2003-168567 | | 6/2003 |
| KR | 9504420 | | 4/1995 |
| WO | WO-1998/050989 | | 11/1998 |
| WO | WO 00/57489 | * | 9/2000 |
| WO | WO 01/33487 | | 5/2001 |
| WO | WO-2001/039554 | | 5/2001 |
| WO | WO 01/64598 | | 9/2001 |
| WO | WO 02/31882 | | 4/2002 |
| WO | WO-2002/071557 | | 9/2002 |

OTHER PUBLICATIONS

J.A. Rogers et al., *Organic Smart Pixels and Complementary Inverter Circuits Formed on Plastic Substrates by Casting and Rubber Stamping*, IEEE Electron Devices Letters, vol. 21, No. 3, Mar. 2000, pp. 100-103.

European Search Report dated Jul. 1, 2004 for Application No. 03009851.1.

C. Wu et al., *P-19: Design of a Novel a-Si PIN/OLED Image Sensor & Display Device*, SID Digest '99, SID International Symposium Digest of Technical Papers, 1999, pp. 528-531.

Tessler.N, Lasers Based on Semiconducting Organic Materials, Adv. Mater. (Advanced Materials), 1999, vol. 11, No. 5, pp. 363-370.

Diffraction by a Periodic Structure, http://www.wias-berlin.de/people/schmidt/diffpage/index.html, Weierstrass Institute.

Maurer.M, "Crystalline Colloidal Array Fabrication,", http://www.personal.psu.edu/mkm20/cca.html.

Office Action (U.S. Appl. No. 200410003980.7) Apr. 20, 2007.

* cited by examiner

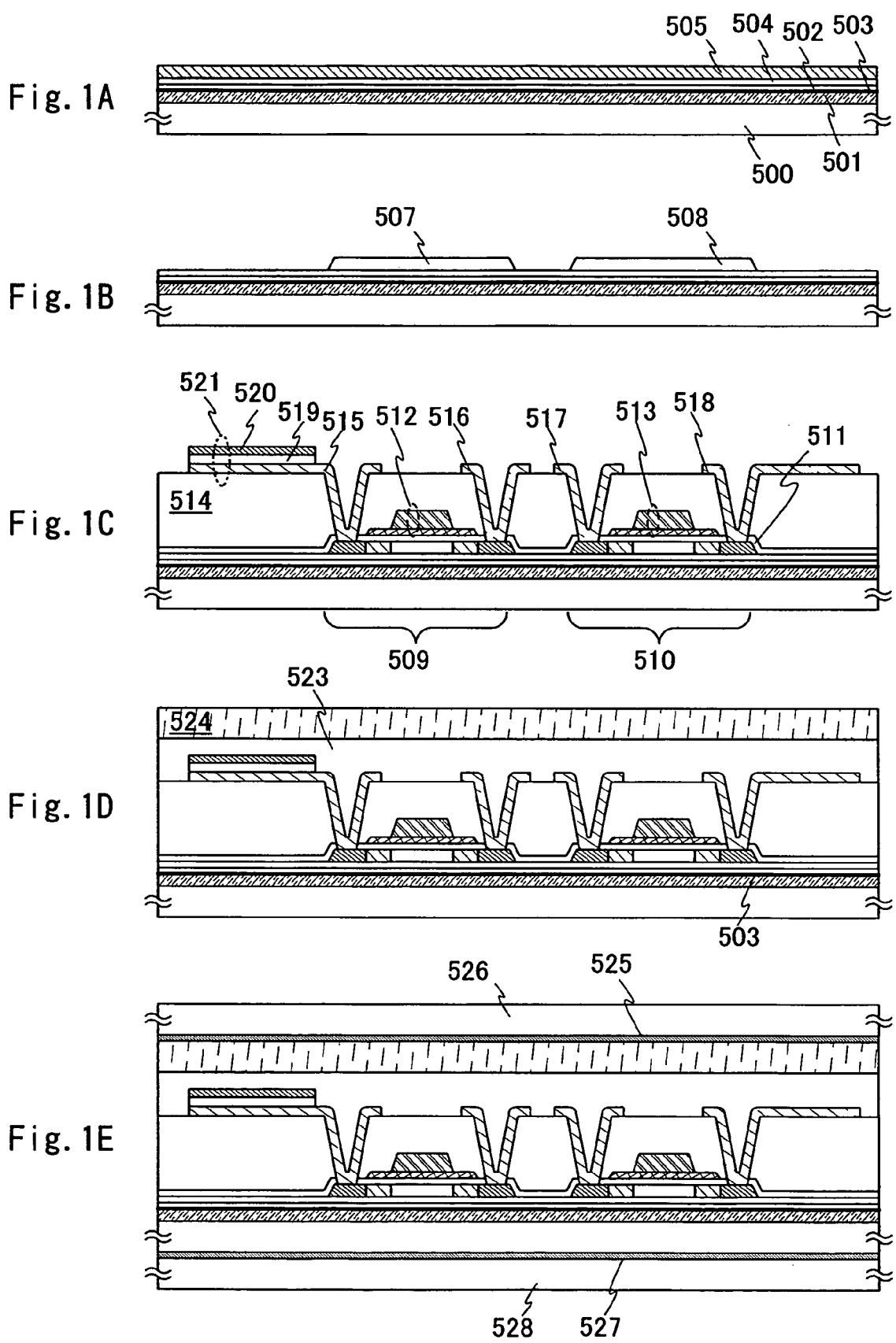

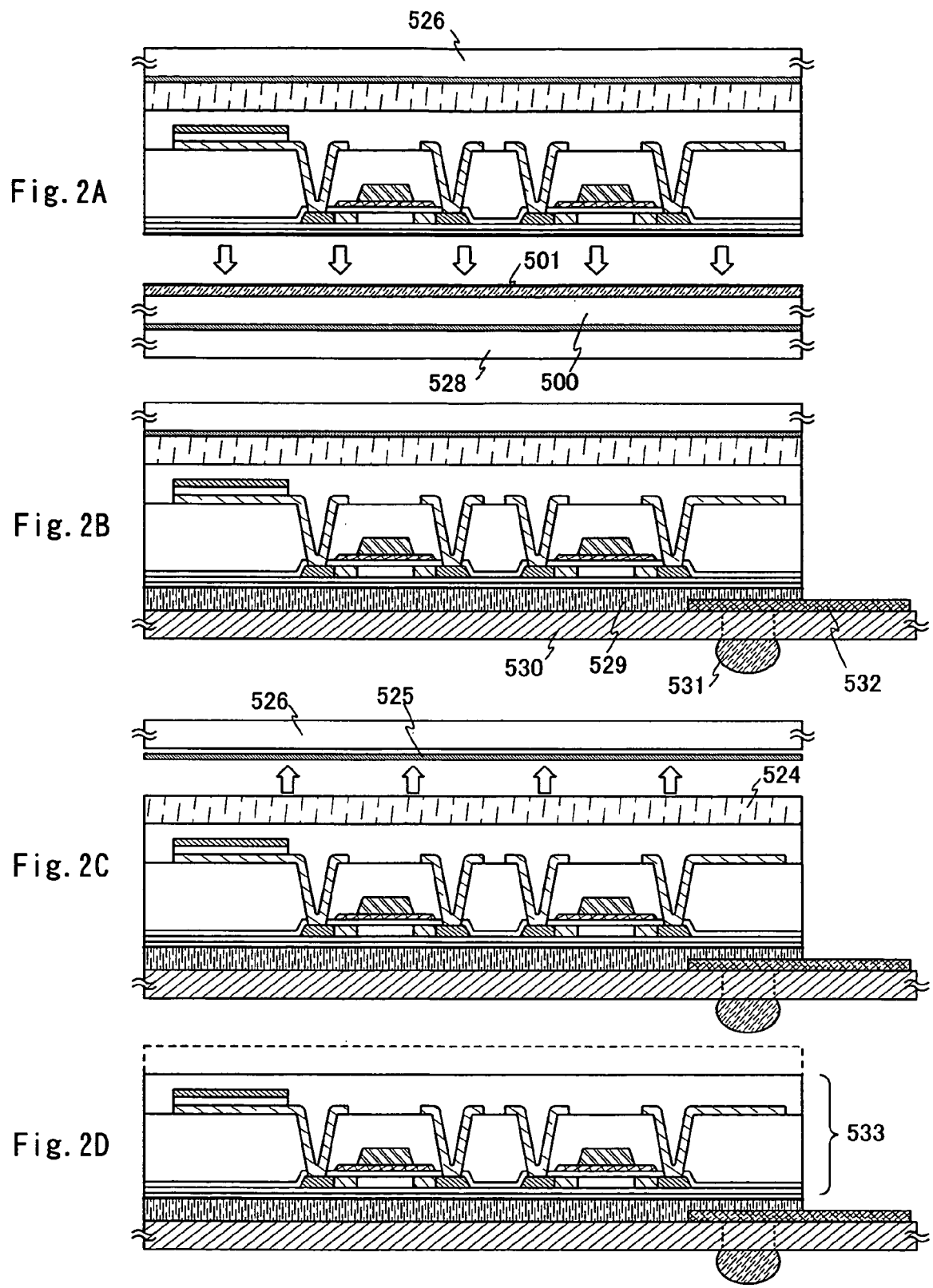

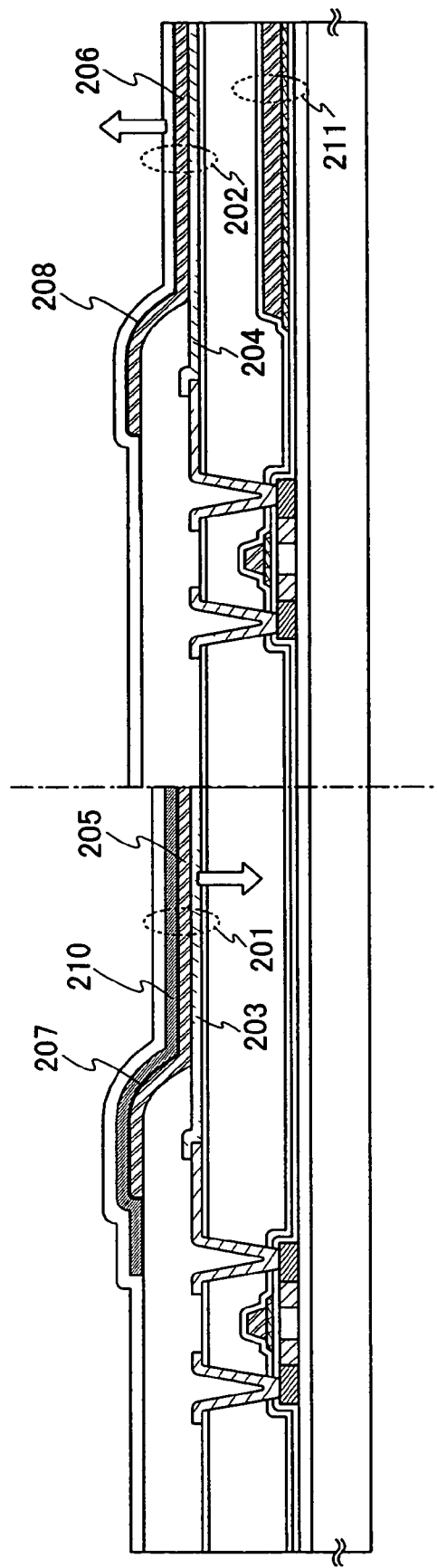

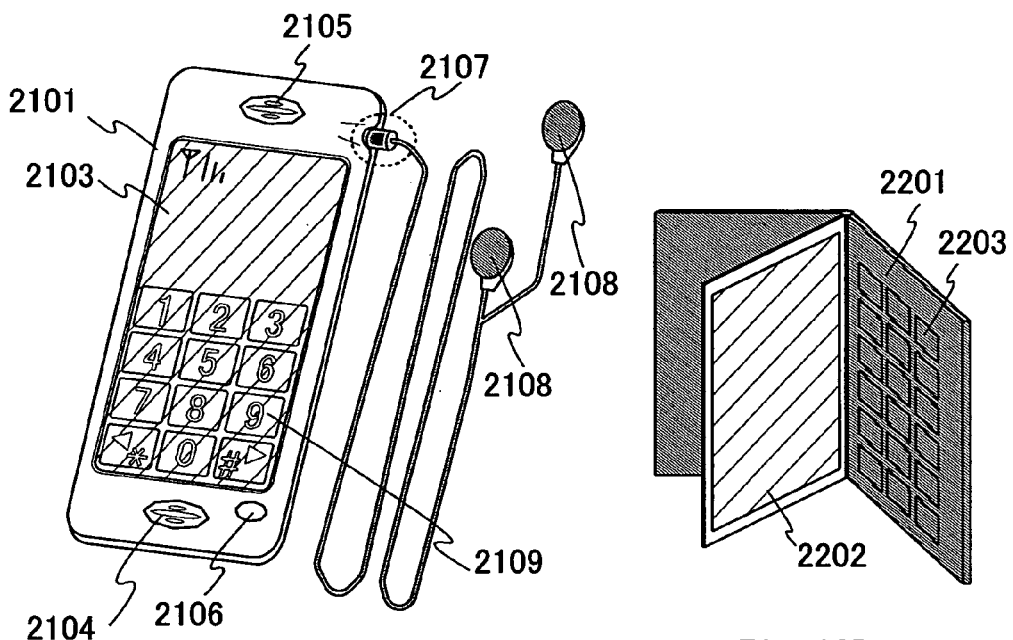
Fig. 13A
Fig. 13B
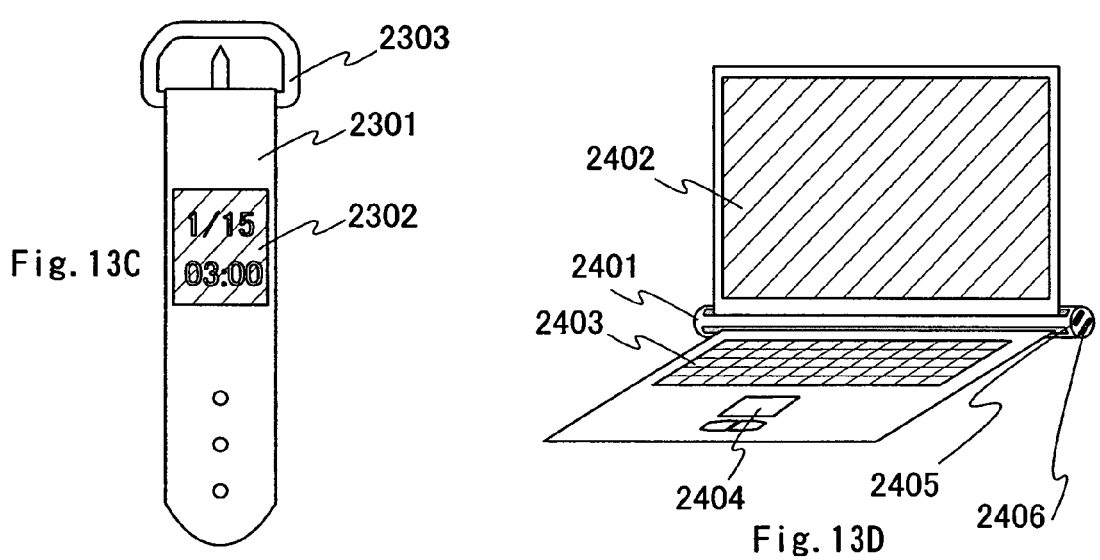
Fig. 13C
Fig. 13D
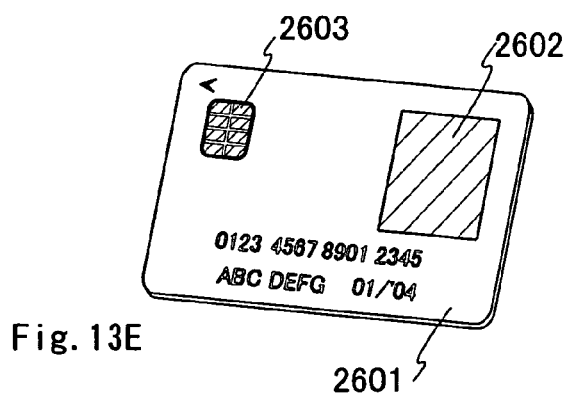
Fig. 13E

SEMICONDUCTOR DEVICE COMPRISING A LIGHT EMITTING ELEMENT AND A LIGHT RECEIVING ELEMENT

BACKGROUND OF THE INVENTION

1. Field of the Invention

The present invention relates to an integrated circuit (thin film integrated circuit) formed by using a semiconductor film which has a crystal structure and is formed on a glass substrate, and more particularly, the invention relates to a thin film integrated circuit in which a signal is transmitted by means of an optical interconnect, and to a semiconductor device using the relevant thin film integrated circuit.

2. Description of the Related Art

As the minimum dimension for LSI approaches a submicron region, a high integration of LSI has been limited. In the case where a sufficient high integration is not realized in an integrated circuit, the wiring resistance is heightened. Therefore, the delay of signals and the disturbance of waveforms occur, the amount of transmission of signals is decreased, and the performance of the information processing of the integrated circuit becomes restricted. Moreover, as wirings are lengthened, a parasitic capacitance between the wirings is increased, and charging and discharging of energy to the wirings are also increased, thus electric power consumption cannot be lowered.

Therefore, a technology for forming a three-dimensional integrated circuit attracts the attention in order to realize higher integration. The three-dimensional integrated circuit is formed by stacking semiconductor elements with an interlayer insulating film interposed therebetween, and this technology is employed to realize much higher integration, higher data rates due to the shortening of the wirings, and multifunction operation of the integrated circuit.

In order to form the three-dimensional integrated circuit, each semiconductor element formed on each layer has to be electrically interconnected. The electrical interconnection between semiconductor elements can be performed by wire bonding or flip chip bonding, or by forming a via hole in an interlayer insulating film which separates each layer. Further, what is called an optical interconnect can be employed, in which an electric signal is converted to an optical signal by using a light emitting element and the semiconductor elements are interconnected through optical transmission.

A technology for data transmission between a CPU, a memory controller and a memory by using an optical signal is disclosed in Patent Document 1 below.

[Patent Document 1]

Japanese Patent Laid-Open No. 2000-58882

As described in Patent Document 1, unnecessary radio wave radiation and skew between data caused by the wiring resistance can be suppressed by means of data transmission using an optical signal.

As mentioned above, three-dimensionalization of the integrated circuit is an essential technology for realizing higher integration. However, as the number of layers is increased so as to increase the amount of information to be processed by a semiconductor device, it becomes more difficult to interconnect each layer.

In the case of using the wire bonding, for example, the adjacent layers are easily interconnected with a thin metal wire, but in the case where two layers to be interconnected are separated from each other, the form of layers interposed between the two layers is restricted in order not to obstruct the formation of a thin metal wire used for interconnecting. Therefore, when semiconductor elements are multilayered and the two layers are interconnected with more layers interposed therebetween, connection with a thin metal wire becomes difficult. Further, the bonding with a thin metal wire is commonly performed in the vicinity of the edge of each layer, thus the area for connecting the thin metal wire is restricted and the number of terminals of each layer cannot be easily increased.

Meanwhile in the case of using the flip chip bonding, since the area for electrically connecting is not restricted, the number of terminals of each layer can be relatively increased as compared with in the case of the wire bonding. As well as the wire bonding, the flip chip bonding is suitable for interconnecting the adjacent layers. However, when two layers to be interconnected are separated from each other, the form of layers interposed between the two layers is restricted in order not to obstruct the connection with a solder ball, therefore, the flip chip bonding is unsuitable for multilayering as well as the wire bonding.

When interconnecting two layers by forming a via hole in an interlayer insulating film therebetween, and the two layers to be interconnected are separated from each other, the via hole has to be formed so as to penetrate all the layers placed between the two layers. The thicker the layers to be penetrated are, the longer the via hole diameter is. Accordingly, high integration of wirings is prevented and this is also unsuitable for mulilayering.

In the case of using the optical transmission, unlike the above-mentioned cases, two layers can be interconnected without restricting the form of the other interposed layers therebetween by using an optical system such as an optical fiber, even when the two layers to be interconnected are separated from each other. However, since the optical fiber is very expensive in general, it is not suitable for a semiconductor device using an integrated circuit in view of a cost thereof.

When a plurality of thin film integrated circuits are sequentially formed to be layered on a substrate, optical transmission can be easily performed without an optical system such as an optical fiber. However, crystallization of a semiconductor film used for a semiconductor element of the upper layer has to be carried out at a temperature equal to or lower than a heat-resistance temperature of the lower layer. Thus, there are many restrictions on manufacturing steps, and it is difficult to form a thin film integrated circuit with a higher performance.

In view of the foregoing, it is the primary object of the invention to provide a semiconductor device, which has a high performance integrated circuit formed on an inexpensive glass substrate and capable of processing the large amount of information, operating at higher data rates.

SUMMARY OF THE INVENTION

To solve the above-described problems, according to the invention, a thin film integrated circuit is formed by using a thin film semiconductor film formed on a heat-resistant substrate, and the thin film integrated circuit is transferred to another substrate. Thus, a plurality of thin film integrated circuits are stacked by repeating the transfer, and a three-dimensionalization of the integrated circuit can be realized. Any substrate may be utilized as a substrate for forming a thin film integrated circuit before transferred as long as the substrate has a heat-resistance enough to withstand the heat treatment in the manufacturing steps of a semiconductor element.

Interconnection between each thin film integrated circuit (hereinafter referred to as thin film chip) on each layer is carried out by what is called an optical interconnect using an optical signal. That is, a light emitting element is provided at the output terminal of a thin film chip on the upper layer, and a light receiving element is provided at the input terminal of a thin film chip on the lower layer so as to face the light emitting element. An electric signal outputted from the thin film chip on the upper layer is converted to an optical signal in the light emitting element and then inputted to the thin film chip on the lower layer after being converted to an electric signal in the light receiving element which has received the optical signal.

The transfer of a thin film chip can be carried out by using a variety of methods: a method of transfer by providing a metal oxide film between a substrate and a thin film integrated circuit and separating the thin film integrated circuit from the substrate after weakening the metal oxide film by crystallization; a method of transfer by providing an amorphous silicon film including hydrogen between a substrate and a thin film integrated circuit and removing the amorphous silicon film by irradiating a laser beam or etching so as to separate the thin film integrated circuit from the substrate; a method of transfer by mechanically removing a substrate on which a thin film integrated circuit is formed or by etching the substrate with solution or gases so as to separate the thin film integrated circuit from the substrate, and the like.

For example, the transfer using a metal oxide film is performed according to the following steps.

First, prepared is a first substrate which has a heat-resistance enough to withstand the heat treatment in the manufacturing steps of a semiconductor element. After forming a metal film on the first substrate, a surface of the metal film is oxidized to form an ultrathin metal oxide film with the thickness of a few nanometers. Next, an insulating film and a semiconductor film are formed to be laminated on the metal oxide film. The insulating film may have a single layer structure or a laminated structure of multilayer. Silicon nitride, silicon oxynitride, silicon oxide and the like can be employed for the insulating film. By using the semiconductor film, a semiconductor element used for a thin film integrated circuit is obtained.

After forming the semiconductor element, a second substrate is attached so that the semiconductor element is covered and sandwiched between the first and second substrates. It is to be noted that in the case of forming a display device as well as the thin film integrated circuit, the second substrate is attached before finishing the formation of a display element. For example, when a liquid crystal cell is employed as a display element, the second substrate is attached after forming a pixel electrode of the liquid crystal cell electrically connected to a thin film transistor (TFT) which is one of the semiconductor elements and forming an alignment film covering the pixel electrode, and then a counter substrate on which a counter electrode is formed is attached.

Subsequently, in order to add the rigidity to the first substrate, a third substrate is attached on the opposite side of the first substrate on which the semiconductor element is formed. By making the first substrate more rigid as compared with the second substrate, the first substrate can be detached smoothly without damaging the semiconductor element. It is to be noted that the third substrate is not necessarily provided when the first substrate has high rigidity enough to withstand the detachment from the semiconductor element.

Subsequently, the metal oxide film is crystallized by a heat treatment so as to weaken the metal oxide film and facilitate the detachment of the first substrate from the semiconductor element. Then, the first substrate and the third substrate are detached simultaneously from the semiconductor element. It is to be noted that the heat treatment for crystallizing the metal oxide film may be carried out either before attaching the third substrate or before attaching the second substrate. Alternatively, the heat treatment conducted in the steps of manufacturing the semiconductor element may be used for crystallizing the metal oxide film.

By this detachement, the metal film is partially separated from the metal oxide film, and the insulating film is partially separated from the metal oxide film, thus the metal oxide film is partially separated into two sides. In either case, the semiconductor element is detached from the first substrate so as to be attached to the second substrate.

Subsequently, the semiconductor element attached to the second substrate after being detached from the first substrate is attached to a substrate used for forming a semiconductor device (hereinafter referred to as an element substrate) with an adhesive or the like. Then, the second substrate is detached so as to transfer the semiconductor element to the element substrate. One thin film chip is formed with the semiconductor element which is fixed on the element substrate. A light receiving element and a light emitting element for interconnecting the thin film chip with other chips may be formed on the element substrate in advance or formed after attaching the thin film chip. Alternatively, an existing light receiving element or light emitting element may be attached on the element substrate and electrically connected to the thin film chip.

In the same way, a thin film integrated circuit for configuring a thin film chip on the next layer is formed on another substrate and transferred so as to be stacked on the thin film chip transferred earlier. By repeating the transfer in this manner, thin film chips can be stacked on the element substrate. At this time, interlayer insulating films formed of resin or the like may be interposed between each thin film chip. Also, the adhesive which is used for transferring may substitute for the interlayer insulating films.

In the case where a display device as well as a thin film chip is transferred, a display element is formed after the transfer. Specifically, in the case of forming a liquid crystal display device, for example, a plastic substrate (hereinafter referred to as a counter substrate) on which a counter electrode, a polarizer and the like are formed is prepared, and after attaching the counter substrate, a liquid crystal is injected to complete a liquid crystal cell. It is to be noted that on the counter substrate may be formed not only the counter electrode and the polarizer but also a color filter, an alignment film, a black matrix and the like.

According to the invention, the thickness of a thin film chip on each layer can be made 5 μm in total, and more preferably, it can be made less than 2 μm in total.

As described above, a thin film chip on each layer can be formed individually according to the invention. Therefore, a manufacturing step of a semiconductor element on the upper layer is not restricted due to the heat resistance of a semiconductor element on the lower layer, thus, a semiconductor element with higher performance can be obtained.

Further, unlike the case in which thin film integrated circuits each formed of a semiconductor film on a glass substrate are stacked to realize the three-dimensionalization, a thin film chip on each layer can be stacked without glass substrates or the like interposed therebetween and thus be in contact with each other. Accordingly, it is not necessary to take into account the diffusion of light due to the glass substrates. In addition, since the distance between a light emitting element and a light receiving element can be made shorter, it is possible to control the directionality of light to some extent.

Incidentally, a plastic substrate having flexibility may be used for an element substrate. For the plastic substrate, ARTON (a product of JSR) formed of norbornen resin with polar group can be used. The plastic substrate may also be formed of polyethylene terephthalate (PET), polyether sulfone (PES), polyethylene naphthalate (PEN), polycarbonate (PC), nylon, polyether ether ketone (PEEK), polysulfone (PSF), polyether imide (PEI), polyarylate (PAR), polybutylene terephthalate (PBT), polyimide, or the like.

By using the plastic substrate having flexibility instead of the glass substrate, a thin film integrated circuit which exhibits improved mechanical resistance to vibration and shock and is reduced in weight can be formed, and thus the thin film integrated circuit can be easily reduced in thickness. Moreover, the form of the thin film integrated circuit can be freely transformed because of the flexibility of the element substrate. For example, the thin film integrated circuit having a curved surface can be formed so as to be attached to a cylindrical bottle or the like.

When forming a semiconductor device by using the thin film integrated circuit according to the invention, an area occupied by the integrated circuit can be made larger. Further, an electronic equipment having the semiconductor device with higher performance can be realized while securing the reduction in weight and size thereof. Specifically, as the usability is dramatically improved by reducing the weight and size, it is very useful to apply the thin film integrated circuit of the invention to a portable electronic equipment.

The optical interconnect allows the data transmission between thin film chips while reducing unnecessary radio wave radiation and skew caused by the wiring resistance. In addition, in the step of converting an electric signal to an optical signal and converting the optical signal to an electric signal, amplitude of electric signals obtained at the end can be freely controlled.

Further, since a signal of one light emitting element can be received by a plurality of light receiving elements, a signal can be transmitted from one thin film chip to other thin film chips at the same time. As a result, an optical bus at much higher data rates can be achieved.

Data transmission between more than three layers of thin film chips can also be achieved with comparative ease without using a particular optical system such as an optical fiber, because each of the thin film chips transmits light unlike a single-crystal silicon wafer. It is to be noted that TFTs formed on a glass substrate operate at a lower rate as compared with single-crystal transistors. However, by using an optical signal for data transmission between thin film chips, a bus width of a signal transmitted between the thin film chips can be widen and circuits on a plurality of thin film chips can efficiently operate in parallel, therefore, it is possible to make up for the low operating rate of the TFTs formed on a glass substrate.

Furthermore, although the integration of the circuit formed on a glass substrate is lower than that of the circuit formed on a single-crystal silicon wafer, a plurality of thin film chips can be stacked by using an optical signal for data transmission between substrates. Thus, the thin film integrated circuits can be prevented from occupying much area in the lateral direction. Moreover, wirings can also be prevented from being lengthened and an increase in power consumption caused by a wiring capacitor can thus be suppressed.

The invention also facilitates the change in the manufacturing step of each thin film chip. That is, unlike the case of simultaneously forming all the circuits on one substrate, an appropriate step can be selected in accordance with a property required for a thin film chip of each layer. Also, by using an inexpensive glass substrate, production at a lower cost can be achieved.

According to the invention, one integrated circuit is configured in combination with a plurality of thin film chips formed separately. Therefore, the production yield can be improved as compared with in the case of simultaneously forming a plurality of integrated circuits on one substrate. Further, by using an optical signal for data transmission between thin film chips, the number of terminals of an FPC or the like used for electrically interconnecting each circuit can be reduced and the mechanical strength can thus be improved. Moreover, yield loss due to contact failures at terminals is eliminated even when the amount of information to be processed is increased.

With reference to a light emitting element and a light receiving element which transmits and receives an optical signal respectively, they are not necessarily disposed at the end of a substrate unlike the terminals of an FPC. Accordingly, the limitation of the layout is raised and it thus facilitates to deal with further increase of the amount of information to be processed.

As described above, the invention enables to provide a semiconductor device having an integrated circuit with higher performance and capable of operating at higher rates.

BRIEF DESCRIPTION OF THE DRAWINGS

FIGS. 1A to 1E show a manufacturing method of a thin film integrated circuit of the invention.

FIGS. 2A to 2D show a manufacturing method of a thin film integrated circuit of the invention.

FIG. 6 shows a structure of a light emitting element used for a thin film integrated circuit of the invention.

FIGS. 13A to 13E show semiconductor devices each using a thin film integrated circuit of the invention.

DETAILED DESCRIPTION OF THE PREFERRED EMBODIMENTS

Embodiment Mode

Figure 3A:
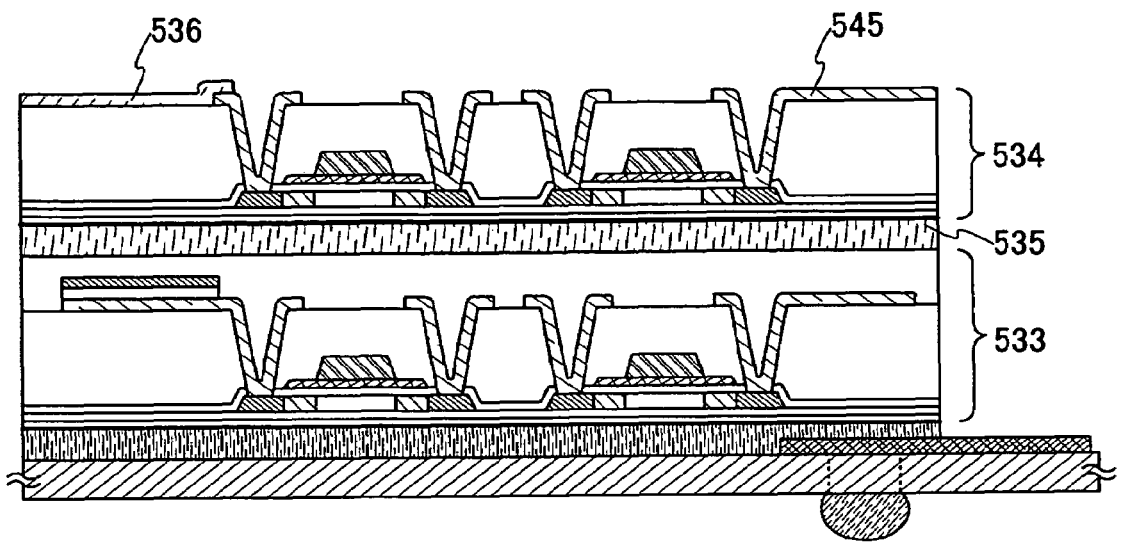
FIGS. 3A and 3B show a manufacturing method of a thin film integrated circuit of the invention.

Explanation is hereinafter made on a manufacturing method of a semiconductor element used for a thin film integrated circuit of the invention and an attaching (transferring) method of the semiconductor element to an element substrate. It is to be noted that although two TFTs are used as the semiconductor elements in this embodiment mode, the semiconductor elements included in a thin film integrated circuit are not limited to them but any circuit element can be employed. For example, as other circuit elements, a memory, a diode, an optoelectric converter, a resistor, a coil, a capacitor, an inductor and the like are typically employed.

First, as shown in FIG. 1A, a metal film 501 is formed on a first substrate 500 by sputtering. A tungsten film is used for the metal film 501 and the film thickness is in the range of 100 to 200 nm, or preferably 50 to 75 nm herein. Note that although the metal film 501 is directly formed on the first substrate 500 in this embodiment mode, an insulating film such as a silicon oxide film, a silicon nitride film and a silicon oxynitride film may be disposed so as to cover the first substrate 500 before forming the metal film 501.

After forming the metal film 501, an oxide film 502 is formed thereon without exposing them to the atmosphere. A silicon oxide film having a thickness of 150 to 300 nm is used for the oxide film 502 herein. Incidentally, in the case of using the sputtering, the metal film 501 and the oxide film 502 are formed at the edge of the first substrate 500. Therefore, it is preferable to selectively remove these films formed at the edge of the first substrate 500 by $O_2$ ashing and the like or to cut the edge of the first substrate 500 by dicing and the like so as to prevent these films from remaining on the first substrate 500 in a removing step.

In forming the oxide film 502, presputtering is performed as the preliminary step of the sputtering, in which a target and the substrate are blocked off with a shutter to generate plasma. This presputtering step is performed by using Ar at a rate of 10 sccm and $O_2$ at a rate of 30 sccm while maintaining the first substrate 500 at a temperature of 270° C. and a deposition power at 3 kW. By the presputtering step, an ultrathin metal oxide film 503 with a thickness of about a few nanometers (3 nm herein) is formed between the metal film 501 and the oxide film 502. Since the metal oxide film 503 is obtained by oxidizing a surface of the metal film 501, the metal oxide film 503 is formed of tungsten oxide in this embodiment mode.

It is to be noted that although the metal oxide film 503 is formed by presputtering in this embodiment mode, the invention is not limited to this. Alternatively, the surface of the metal film 501 may be intentionally oxidized with plasma by adding $O_2$ or a mixture of $O_2$ and an inert gas such as Ar so as to form the metal oxide film 503.

After forming the oxide film 502, a base film 504 is formed by a plasma chemical vapor deposition (PCVD). A silicon oxynitride film having a thickness of approximately 100 nm is used for the base film 504. After forming the base film 504, a semiconductor film 505 is formed thereon without exposing them to the atmosphere. The thickness of the semiconductor film 505 is in the range of 25 to 100 nm (preferably 30 to 60 nm), and either an amorphous semiconductor or a polycrystalline semiconductor can be employed for the semiconductor film 505. As a semiconductor material, silicon germanium can be employed as well as silicon. In the case of using silicon germanium, the germanium concentration is preferably in the range of 0.01 to 4.5 atomic %.

Then, the semiconductor film 505 is crystallized in a known manner Thermal crystallization using an electric furnace, laser crystallization using laser beam, and lump annealing crystallization using infrared light are employed in the crystallization. Alternatively, crystallization may be performed by using a catalyst element as disclosed in Japanese Patent Laid-Open No. H7-130652.

Incidentally, the polycrystalline semiconductor film 505 may be formed in advance by sputtering, a plasma CVD, a thermal CVD or the like.

In this embodiment mode, the semiconductor film 505 is crystallized by laser crystallization. When the crystallization is performed by a continuous wave solid-state laser using the second to fourth harmonic of the fundamental wave thereof, crystals of large grain size can be obtained. Typically, the second harmonic (532 nm) or third harmonic (355 nm) of an Nd: $YVO_4$ laser (fundamental wave: 1064 nm) is desirably employed. Specifically, laser beam emitted from a continuous wave $YVO_4$ laser is converted into harmonic by a non-linear optical element to obtain laser beam with output of 10W. Alternatively, harmonic may be emitted by using a non-linear optical element. The harmonic is preferably shaped into oblong or elliptical laser beam on an irradiation surface by an optical system and then irradiates the semiconductor film 505. The energy density required at this point is approximately 0.01 to 100 $MW/cm^2$ (preferably 0.1 to 10 $MW/cm^2$). During the irradiation, the semiconductor film 505 is moved relative to the laser beam at a rate of approximately 10 to 2000 cm/s.

For laser irradiation of the laser crystallization, laser beam of continuous fundamental wave and laser beam of continuous harmonic can be employed, or laser beam of continuous fundamental wave and laser beam of pulse wave can also be employed.

Incidentally, laser beam may be irradiated in the atmosphere of an inert gas such as a noble gas or nitrogen. According to this, the surface of the semiconductor film is prevented from being roughened through the laser irradiation and fluctuation in threshold caused by the variation in interface level density can be reduced.

The semiconductor film 505 is enhanced in crystallinity by the laser irradiation described above. Then, as shown in FIG. 1B, island-shaped semiconductor films 507 and 508 are formed by patterning of the semiconductor film 505 having an even higher crystallinity, and semiconductor elements typified by TFTs are formed by using the island-shaped semiconductor films 507 and 508. It is to be noted that although the island-shaped semiconductor films 507 and 508 are formed directly on the base film 504 in this embodiment mode, an electrode or an insulating film and the like may be interposed between the base film 504 and the island-shaped semiconductor films 507 and 508 depending on the semiconductor elements. In the case where a bottom gate TFT is employed as a semiconductor element, for example, a gate electrode and a gate insulating film are formed between the base film 504 and the island-shaped semiconductor films 507 and 508.

In this embodiment mode, top gate TFTs 509 and 510 are formed by using the island-shaped semiconductor films 507 and 508 (FIG. 1C). Specifically, a gate insulating film 511 is formed so as to cover the island-shaped semiconductor films 507 and 508. Then, a conductive film is disposed on the gate insulating film 511, and gate electrodes 512 and 513 are formed by patterning the conductive film. Subsequently, an n-type impurity is implanted into the island-shaped semiconductor films 507 and 508 by using as a mask the gate electrodes 512 and 513 or a resist which has been formed and patterned, and thus a source region, a drain region, an LDD region and the like are obtained. Although the n-type TFTs 509 and 510 are formed herein, p-type TFTs can be employed as well, and in this case, a p-type impurity is implanted into the semiconductor film.

The TFTs 509 and 510 are formed through a series of steps described above, however, the manufacturing method of TFTs is not limited to these steps.

Subsequently, a first interlayer insulating film 514 is formed so as to cover the TFTs 509 and 510. After forming contact holes in the gate insulating film 511 and the first interlayer insulating film 514, terminals 515 to 518 which are connected to the TFTs 509 and 510 through the contact holes are formed so as to be made in contact with the first interlayer insulating film 514.

The terminal 515 is partially employed for a cathode electrode of a light receiving element (optoelectric converter). The terminals 515 to 518 are formed of aluminum which is deposited by sputtering, though a material for the terminals is not limited to this. Other metal materials, such as titanium, tantalum, tungsten, copper or a laminated film composed of titanium, aluminum and titanium, are available as well.

After forming an amorphous silicon film containing hydrogen over the whole substrate, an optoelectric conversion layer 519 is formed by patterning the amorphous silicon film. Then, a transparent conductive film is formed over the whole substrate. For the transparent conductive film, an ITO having a thickness of 200 nm is formed by sputtering in this embodiment mode. Subsequently, the transparent conductive film is patterned to form an anode electrode 520 (FIG. 1C). An overlapping area of the terminal 515 used as a cathode electrode, the optoelectric conversion layer 519 and the anode electrode 520 serves as a light receiving element 521.

It is to be noted that the structure of the light receiving element is not limited to the one shown in FIG. 1C, and it can be appropriately determined by a practitioner in accordance with the direction of incidence of light received by the light receiving element.

Then, a second interlayer insulating film 523 is formed over the first interlayer insulating film 514 so as to cover the light receiving element 521 and the terminals 515 to 518. The second interlayer insulating film 523 is provided with the intention of protecting the light receiving element 521 in a step of attaching, therefore, it is not necessarily provided and a protective layer 524 formed later may serve as a protector of the light receiving element.

Subsequently, the protective layer 524 is formed so as to cover the second interlayer insulating film 523. The protective layer 524 serves as a protector of semiconductor elements when attaching and detaching a second substrate. Accordingly, a material which is removable after detachment of the second substrate is employed for the protective layer 524. For example, epoxy resin, acrylate resin, or silicon resin which are soluble in water or alcohols are coated over the whole substrate and baked to obtain the protective layer 524.

In this embodiment mode, a film formed of water-soluble resin (a product of TOAGOSEI Co., Ltd.: VL-WSHL10) is spin-coated to have a thickness of 30 μm and exposed to light for two minutes so as to be partially cured, then, exposed its back to UV rays for 2.5 minutes and exposed its surface to UV rays for 10 minutes so as to be fully cured. Thus, the protective layer 524 can be obtained (FIG. 1D).

It is to be noted that in the case of stacking a plurality of organic resin, there is a threat that the plural organic resin is melted partially or is too adhesive when coated or baked. Therefore, in the case where organic resin soluble in the same solution is used for each of the second interlayer insulating film 523 and the protective layer 524, an inorganic insulating film (a SiNx film, a SiNxOy film, an AlNx film, or an AlNxOy film) is preferably formed between the second interlayer insulating film 523 and the protective layer 524 formed thereon in order that the protective layer 524 can be easily removed in the following step.

Then, the metal oxide film 503 is crystallized so as to be removed easily in the following step. The crystallization facilitates the metal oxide film 503 cracking in a boundary region, thus produces a more brittle film. In this embodiment mode, the crystallization is carried out by heating the film at 420 to 550° C. for approximately 0.5 to 5 hours.

The adhesiveness of the metal oxide film 503 and the oxide film 502 or the adhesiveness of the metal oxide film 503 and the metal film 501 is partially weakened for easy detachment. Specifically, the partially wakening step of adhesiveness is carried out by pressuring locally from outside on the region to be detached along with the periphery thereof for damaging the inside or a part of the boundary face of the metal oxide film 503. In this embodiment mode, a hard needle such as a diamond pen is attached perpendicular to the metal oxide film 503 and moved along with the periphery thereof with applying loading. Preferably, a scriber device may be used to move with applying loading on the region with press force ranging from 0.1 to 2 mm. Such preparatory step for weakening the adhesiveness partially will prevent poor detachment and improve the production yield.

Next, a second substrate 526 is attached to the protective layer 524 with a two-sided tape 525 and a third substrate 528 is attached to the first substrate 500 with a two-sided tape 527 (FIG. 1E). Incidentally, an adhesive may substitute for the two-sided tape. By using an adhesive detachable by UV rays, for example, the second substrate 526 can be detached while reducing damages of the semiconductor elements.

The third substrate 528 prevents the first substrate 500 from being damaged in the following step of detachment. For the second substrate 526 and the third substrate 528, a substrate having as high rigidity as that of the first substrate 500 or higher rigidity than that of the first substrate 500, such as a quartz substrate or a semiconductor substrate, is preferably to be used.

Subsequently, the metal film 501 is detached from the oxide film 502 physically. The detachment is started from the region in which the adhesiveness of the metal oxide film 503 and the metal film 501 or the adhesiveness of the metal oxide film 503 and the oxide film 502 is partially weakened in the preceding step.

According to this, the metal oxide film 503 is separated partially from the metal film 501, partially from the oxide film 502, and the metal oxide film 503 is partially separated into two sides. Thus, the second substrate 526 to which the semiconductor elements (the TFTs 509 and 510 herein) are attached is separated from the third substrate 528 to which the first substrate 500 and the metal film 501 are attached. The detachment can be performed by relatively small force (for example, man's hand, air pressure of gas sprayed from a nozzle, ultrasonic waves or the like). FIG. 2A shows a state after the detachment.

Next, with an adhesive 529, a substrate (element substrate) 530 to be used for forming a thin film integrated circuit is attached to the oxide film 502 to which the metal oxide film 503 is partially attached (FIG. 2B). What is important in selecting a material for the adhesive 529 is that the adhesive strength of the oxide film 502 and the element substrate 530 with the adhesive 529 is higher than that of the second substrate 526 and the protective layer 524 with the two-sided tape 525.

It is to be noted that the metal oxide film 503 may be completely removed by etching or the like before being attached to the element substrate 530, because the adhesiveness of the oxide film 502 and the element substrate 530 can be weakened when the metal oxide film 503 remains on the surface of the oxide film 502.

For the adhesive 529, various types of curing adhesive, for example, a photo-curing adhesive such as a reaction-curing adhesive, a heat-curing adhesive, a UV-curing adhesive, or an anaerobic adhesive is utilized. It is more preferable that the adhesive 529 contains powder composed of silver, nickel, aluminum, and aluminum nitride, or filler to have high thermal conductivity.

According to this embodiment mode, an interposer provided with a solder ball 531 is also employed as the element substrate 530. The solder ball 531 is exposed on the opposite surface of the element substrate 530 on which the thin film integrated circuit is provided, and through a contact hole formed in the element substrate 530, the solder ball 531 is electrically connected to a wiring 532 provided on the surface of the element substrate 530 on which the thin film integrated circuit is provided. The wiring 532 is formed by plating copper with solder, gold or tin, for example.

Subsequently, as shown in FIG. 2C, the two-sided tape 525 and the second substrate 526 are detached in this order or at the same time from the protective layer 524. It is to be noted that in the case of using the UV-curing adhesive for the adhesive 529 and using a tape or an adhesive detachable by UV rays for the two-sided tape 525, the detachment of the two-sided tape 525 and curing of the adhesive 529 can be carried out at the same time.

Then, the protective layer 524 is removed as shown in FIG. 2D. Since a resin which is soluble in water is utilized herein, the protective layer 524 is dissolved in water to be removed. In the case where residue of the protective layer 524 causes the deterioration of the device, it is preferable that cleaning or treating in $O_2$ plasma is performed to detach a part of the residue of the protective layer 524.

Although tungsten is utilized for the metal film 501 in this embodiment mode, the material for the metal film 501 is not limited to this in the invention. Any material including metal can be utilized as long as the metal oxide film 503 can be formed thereon and the substrate can be detached by crystallizing the metal oxide film 503. For example, TiN, WN, Mo or the like or alloy of these materials can be employed. In case of employing the alloy for the metal film, the optimum temperature of heating in crystallization is varied in accordance with a composition ratio thereof. Therefore, by varying the composition ratio, heating step can be performed at the temperature which does not obstruct the manufacturing steps of the semiconductor elements, and the semiconductor elements can thus be manufactured with few restrictions.

After transferring a first thin film integrated circuit 533 to the element substrate 530 as shown in FIG. 2D, a second thin film integrated circuit 534 is transferred to the first thin film integrated circuit 533 as shown in FIG. 3A. The transfer of the second thin film integrated circuit 534 can be performed in the same manner as the transfer of the first thin film integrated circuit to the element substrate 530. That is, a first substrate is prepared to form the second thin film integrated circuit 534 thereon, and a second substrate is attached so as to cover the second thin film integrated circuit 534. After reinforcing the first substrate with a third substrate, a metal oxide film provided between the first substrate and the second thin film integrated circuit 534 is crystallized and weakened, and then the first substrate as well the third substrate is detached and removed. Subsequently, the second thin film integrated circuit 534 attached to the second substrate is attached on the first thin film integrated circuit 533 with an adhesive 535, and the second substrate is removed to complete the transferring.

The distance between the first thin film integrated circuit 533 and the second thin film integrated circuit 534 can be controlled by varying the thickness of the adhesive 535. The thickness of the adhesive depends on the pressure exerted in the attachment, and in this embodiment mode, it is assumed to be approximately 20 μm.

According to this embodiment mode, a light emitting element is formed after transferring the second thin film integrated circuit 534. A pixel electrode 536 of the light emitting element is formed on the second thin film integrated circuit 534 before the second thin film integrated circuit 534 is transferred to the first thin film integrated circuit 533. The pixel electrode 536 is formed of a transparent conductive film, and in this embodiment mode, an ITO is employed.

Although the transparent conductive film is utilized for the pixel electrode of the light emitting element, the invention is not limited to this. It is preferable to optimize the structure of the light emitting element in accordance with a directionality of light from the light emitting element, namely, whether to turn the light from the light emitting element to the element substrate side or the opposite side.

Figure 3B:
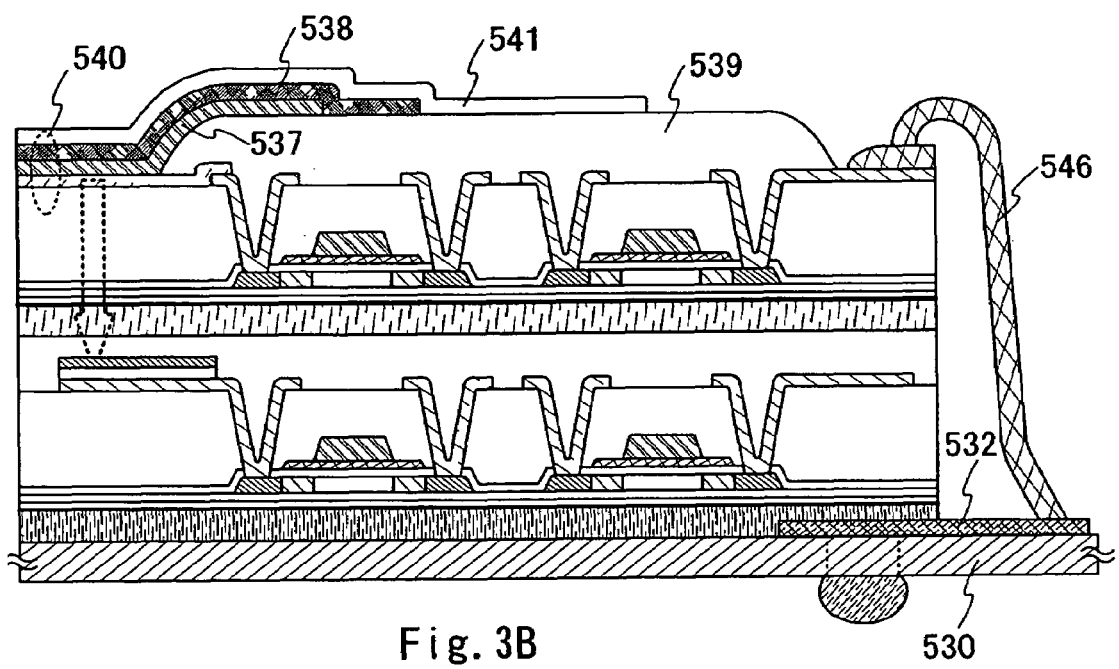

Next, as shown in FIG. 3B, formed is a third interlayer insulating film 539 having opening portions which partially expose the pixel electrode 536 and a terminal 545 electrically connected to the thin film integrated circuit. Although a transferring method of the second thin film integrated circuit just after forming the pixel electrode is described in this embodiment mode, it is also possible to transfer the second thin film integrated circuit after forming the third interlayer insulating film as well as the pixel electrode.

On the opening portion of the third interlayer insulating film 539, which exposes the pixel electrode 536, an electro-luminescent layer 537 and a cathode 538 are formed to be laminated in this order. An overlapping area of the pixel electrode 536, the electro-luminescent layer 537 and the cathode 538 corresponds to a light emitting element 540.

It is to be noted that a transparent conductive film provided by mixing 2 to 20% of zinc oxide (ZnO) with indium oxide as well as the ITO may be utilized for the pixel electrode 536. The surface of the pixel electrode 536 may be rubbed by CMP and cleaned by a swab using a polyvinyl alcohol porous body to be flat. After rubbing it by CMP, irradiation of UV rays, $O_2$ plasma processing or the like may be performed to clean the surface of the pixel electrode 536.

The electro-luminescent layer 537 is structured by a single light emitting layer or by a plurality of layers including a light emitting layer. For a material of the cathode 538, any one of known transparent conductive films having a small work function, and preferably using a material such as Ca, Al, CaF, MgAg and AlLi, may be employed.

Incidentally, the third interlayer insulating film 539 is preferably heated in a vacuum atmosphere in order to remove absorbed moisture and oxygen before forming the electro-luminescent layer 537. Specifically, heat treatment is applied in a vacuum atmosphere, at a temperature of from 100 to 200° C. and for approximately from 0.5 to 1 hour. The vacuum is desirably set at $3\times10^{-7}$ Torr or less, and if possible, at $3\times10^{-8}$ Torr or less. In the case where the electro-luminescent layer 537 is formed after applying the heat treatment to the third interlayer insulating film 539 in the vacuum atmosphere, the reliability can be further improved by maintaining the electro-luminescent layer 537 in the vacuum atmosphere until immediately before the deposition.

Furthermore, an end portion in the opening portion of the third interlayer insulating film 539, in which the pixel electrode 536 is exposed, is preferably formed to be roundish. According to this, the electro-luminescent layer 537 can be prevented from being too thinned and broken at the end portion, and the pixel electrode and the cathode can also be inhibited from short circuiting, and thus, a defect of the light emitting element can be suppressed. Moreover, by alleviating the stress at the end portion of the electro-luminescent layer 537, a defect called shrink in which a light emitting region is diminished can be reduced and the reliability can thus be improved. Specifically, a radius of curvature of a curve that a cross section of the organic resin film in the opening portion depicts is desirably in the range of approximately from 0.2 to 2 μm.

The light emitting element 540 is covered with a protective film 541 in order to prevent a substance such as moisture or oxygen from entering in the light emitting element 540 and accelerating the deterioration of the light emitting element 540. Typically, a film such as a DLC film, a carbon nitride film, or a silicon nitride film formed by means of an RF sputtering is preferably utilized for the protective film 541. It is also possible to employ for the protective layer by laminating a film which transmits the moisture, the oxygen or the like with difficulty and a film which transmits the moisture, the oxygen or the like relatively with ease.

Furthermore, after forming the protective film 541, the light emitting element 540 may be covered with a resin to which a drying agent is added in order to strengthen the sealing of the light emitting element. Incidentally, the resin with a drying agent may be employed for attaching a thin film integrated circuit transferred in the following step.

Although an OLED (Organic Light Emitting Device) using an electro luminescence is taken for example of a light emitting element in this embodiment mode, the invention is not limited to this. According to the invention, other light emitting elements such as an LED (Light Emitting Diode) or a semiconductor laser can also be utilized. The light emitting element desirably has a directionality of light.

According to this embodiment mode, a light from the light emitting element 540 of the second thin film integrated circuit 534 is inputted to the light receiving element 521 of the first thin film integrated circuit 533. Therefore, an electric signal outputted from the second thin film integrated circuit 534 is converted to an optical signal in the light emitting element 540, and the optical signal is reconverted to an electric signal in the light receiving element 521 so as to be inputted to the first thin film integrated circuit 533.

Further, the terminal 545 electrically connected to the second thin film integrated circuit 534 is connected to the wiring 532 provided on the surface of the element substrate 530 by wire bonding. Specifically, a wire 546 is utilized for connecting as shown in FIG. 3B. A power supply voltage and various types of signals can be supplied to the thin film integrated circuits via the wiring 532. It is to be noted that electrically connecting to the thin film integrated circuits may not necessarily be carried out by wire bonding but may also be carried out by flip chip bonding. Moreover, all the external signals may be supplied by optical transmission.

Also in this embodiment mode, the wire 546 is connected to the second thin film integrated circuit 534, though the invention is not limited to this structure. For example, a solder ball electrically connected to the semiconductor elements may be provided on the opposite surface of the element substrate 530 on which the first thin film integrated circuit 533 is formed, and the solder ball may be connected by flip chip bonding to the wiring 532 provided on the surface of the element substrate 530.

In such a manner, by optical transmission between the thin film integrated circuits by means of a light emitting element and a light receiving element, signals can be transmitted and received between each layer and a power supply voltage can be supplied to each layer. Thus, a thin film integrated circuit is structured by a plurality of stacked thin film chips (thin film integrated circuits). It is to be noted that although the two layers of thin film integrated circuits are used to form a thin film integrated circuit in this embodiment mode, the number of thin film integrated circuits is not limited to this, but three or more layers of thin film integrated circuits may be stacked to form a thin film integrated circuit.

It is also to be noted that the element substrate is not limited to an interposer such as of the one using a glass-epoxy material but a substrate using other materials may also be utilized.

Further, according to the invention, a transferring method of a thin film integrated circuit is not limited to the above-described method using a metal oxide film. Alternatively, an amorphous silicon film may be provided between the first substrate and the thin film integrated circuit for example, and the thin film integrated circuit may be detached from the first substrate by performing laser irradiation or etching to the amorphous silicon film.

Figure 4A:
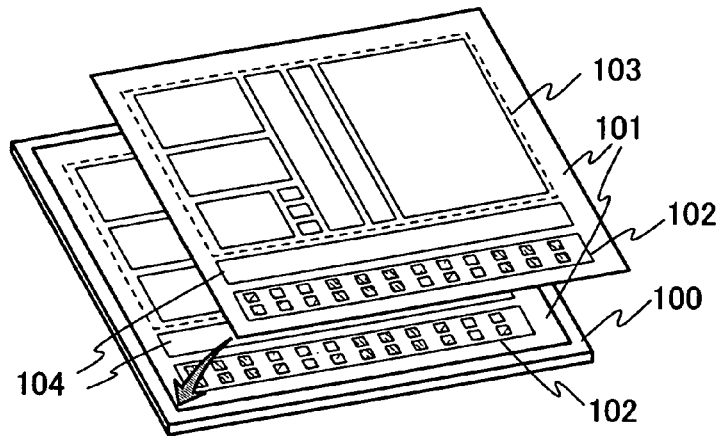
FIGS. 4A to 4C show configurations of a thin film integrated circuit of the invention.

With reference to FIG. 4A, explanation is hereinafter made on how a light emitting element and a light receiving element are arranged between each layer when stacking a plurality of thin film integrated circuits. FIG. 4A is a pattern view of thin film integrated circuits stacked on an element substrate 100.

A thin film chip (thin film integrated circuit) 101 on each layer includes one or a plurality of circuits 103. In addition, the thin film integrated circuit 101 on each layer includes one or a plurality of regions in which a light emitting element and a light receiving element for transmitting and receiving optical signals are arranged. In FIG. 4A, the regions in which a light emitting element or a light receiving element for optical transmission is provided are denoted by optical transmitting portions 102. Each thin film integrated circuit 101 also includes an interface 104 which converts and reconverts to an electric signal in order to exchange the electric signal between the optical transmitting portions 102 and the circuits 103.

Figure 4B:
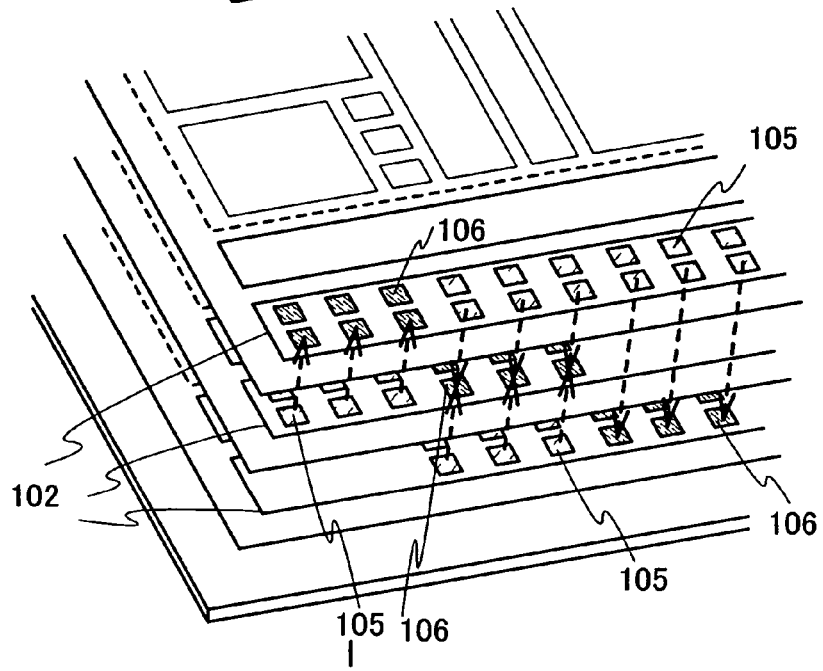

Each optical transmitting portion 102 includes a light receiving element for receiving an optical signal and a light emitting element for transmitting an optical signal. FIG. 4B is an enlarged view of the optical transmitting portion 102 on each layer. In FIG. 4B, reference numerals 105 and 106 correspond to a light emitting element and a light receiving element respectively. A light emitting element 105 and a light receiving element 106 which are provided in each thin film integrated circuit correspond respectively to a light receiving element 106 and a light emitting element 105 which are provided in other thin film integrated circuits. It is to be noted that although the light emitting elements 105 and the light receiving elements 106 are both arranged in the optical transmitting portions 102 in FIGS. 4A and 4B, the invention is not limited to this configuration. The light emitting elements 105 and the light receiving elements 106 may be placed in the circuit 103. Also, a circuit element serving as the interface 104 may be placed in the circuit 103 in accordance with a layout of the light emitting elements 105 and the light receiving elements 106.

Further, all the interconnections between each layer are performed by optical transmission in FIG. 4A, though the invention is not limited to this. Various types of signals and a power supply voltage may be partially transmitted and received as electric signals, and a function for transmitting and receiving electric signals, such as a terminal, may be provided.

Figure 4C:
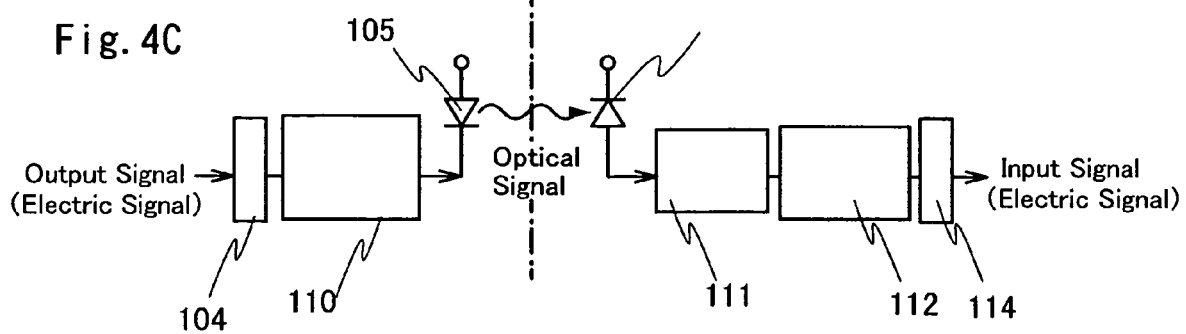

FIG. 4C shows a configuration example of the optical transmitting portions 102 and the interface 104 more specifically. At least one light receiving element 106 corresponds to a light emitting element 105. In FIG. 4B, only the light emitting elements 105 and the light receiving elements 106 are provided in the optical transmitting portions 102. However in practice, a driver circuit for light emitting element 110 for controlling a light emission of the light emitting element 105 by an electric signal, an amplifier circuit 111 for amplifying an electric signal received in the light receiving element 106, a waveform shaper circuit 112 for shaping a waveform of the received electric signal and the like are provided in the optical transmitting portions 102 as shown in FIG. 4C. It is to be noted that the interface 104 and an interface 114 may substitute for these functions.

An electric signal (output signal) outputted from a circuit is converted to a signal in accordance with the specification of the driver circuit for light emitting element 110 in the interface 104, and then inputted to the driver circuit for light emitting element 110. The driver circuit for light emitting element 110 controls a light emission of the light emitting element 105 in accordance with the inputted output signal.

The light receiving element 106 receives an optical signal transmitted from the light emitting element 105 and converts the optical signal to an electric signal. The electric signal converted in the light receiving element 106 is amplified in the amplifier circuit 111, shaped the waveform in the waveform shaper circuit 112, reconverted in accordance with the specification of each circuit in the interface 114, and inputted to the subsequent circuit as an input signal. It is to be noted that the amplifier circuit 111 and the waveform shaper circuit 112 are not necessarily provided, and other circuits may be provided in order to perform some treatment to the waveforms of electric signals.

The light emitting element corresponds to the light receiving element one by one in FIG. 4C, though the invention is not limited to this configuration. Two or more light emitting elements may correspond to one light receiving element, or one light emitting element may correspond to two or more light receiving elements.

Figure 5A:
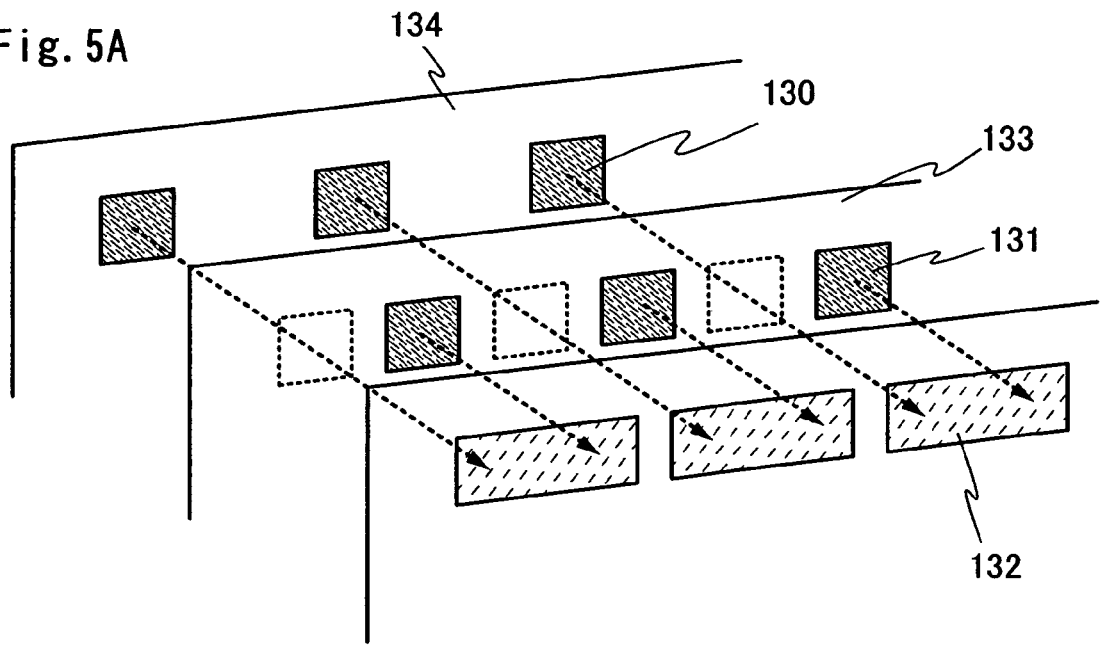
FIGS. 5A and 5B show configurations of a thin film integrated circuit of the invention

With reference to FIG. 5A, explanation is made on a configuration in which light emitting elements 130 and 131 each formed on a thin film integrated circuit of different layers correspond to one light receiving element 132 formed on a thin film integrated circuit of another layer. The light emitting element 130 is placed so that a light emission thereof is transmitted through a layer 133 on which the light emitting element 131 is formed, and entered to the light receiving element 132. According to this configuration, while an optical signal is transmitted from the light emitting element 130 to the light receiving element 132, a thin film integrated circuit of the layer 133 on which the light emitting element 131 is formed can perform other operations, and conversely, while an optical signal is transmitted from the light emitting element 131 to the light receiving element 132, a thin film integrated circuit of a layer 134 on which the light emitting element 130 is formed can perform other operations.

On the other hand, in the case where two light receiving elements each formed on a thin film integrated circuit of different layers correspond to one light emitting element formed on a thin film integrated circuit of another layer, optical signals can be transmitted to thin film integrated circuits of a plurality of layers at the same time.

Figure 5B:
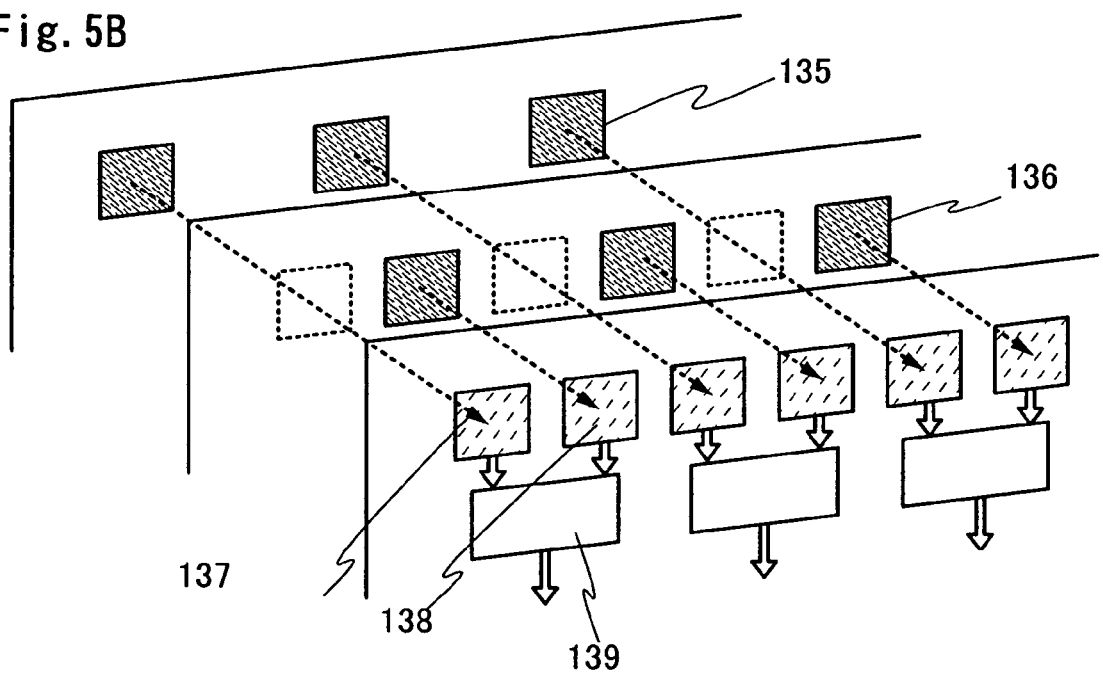

In FIG. 5B, a selector circuit is provided in order to select one of electric signals received in a plurality of light receiving elements and to transmit the selected electric signal to the subsequent circuit. As shown in FIG. 5B, optical signals transmitted from light emitting elements 135 and 136 each formed on a thin film integrated circuit of different layers are converted to electric signals in light receiving elements 137 and 138 formed on a thin film integrated circuit of another layer. A selector circuit 139 selects either of the two converted electric signals and transmits it to the subsequent circuit. According to the above-described configuration as well as that shown in FIG. 5A, the oscillator frequency per light emitting element can be lowered and the task of a light emitting element driver portion which controls the drive of light emitting elements can also be reduced.

It is to be noted that in order to perform the data transmission in parallel by using optical signals between the thin film integrated circuits, each pathway of the optical signals has to be made independent. However, depending on the degree of the light diffusion, what is called a cross talk may occur, where an optical signal is entered in a light receiving element to which the optical signal does not correspond. The degree of the light diffusion is dependent on the directivity of the light emitted from the light emitting element and the refractive index of the medium in the pathway of an optical signal. Hence, it is desirable to take the light diffusion into account so that the cross talk is suppressed as much as possible, arrange light receiving elements and light emitting elements in accordance with the directivity of the light from the light emitting element to be used, and appropriately set the thickness of thin film integrated circuits, the distance between the thin film integrated circuits, and the medium between the thin film integrated circuits (adhesive or the like). Moreover, in order to prevent the cross talk, an optical fiber having a cylindrical or an approximately cylindrical cross section as well as an optical waveguide such as a thin film waveguide for transmitting the light along the planar dielectric thin film may be provided on the pathway of an optical signal.

Note that substrates used in the invention are not limited to glass substrates. Needless to say, it is possible to use other substrates such as plastic substrates as long as they have transparency and are capable of withstanding a heat treatment in manufacturing steps of forming a semiconductor element or the other steps.

Although signals are transmitted by optical transmission between a plurality of layers in this embodiment mode, the signals may be transmitted by optical transmission in one thin film integrated circuit of a layer.

A thin film integrated circuit of the same layer may include both of a light emitting element which emits light in the direction of an element substrate and a light emitting element which emits light in the opposite direction of the element substrate. FIG. 6 shows a cross-sectional view of a thin film integrated circuit in which two light emitting elements each having different output directions of light are formed.

Light emitting elements 201 and 202 shown in FIG. 6 have the same structure of element. The two light emitting elements 201 and 202 include pixel electrodes 203 and 204 each formed of a transparent conductive film, electro-luminescent layers 205 and 206, and cathodes 207 and 208, respectively. An overlapping area of the pixel electrode 203, the electro-luminescent layer 205 and the cathode 207 corresponds to the light emitting element 201, and an overlapping area of the pixel electrode 204, the electro-luminescent layer 206 and the cathode 208 corresponds to the light emitting element 202.

In FIG. 6, each of the electro-luminescent layers 205 and 206 included in the light emitting elements 201 and 202 respectively has a laminated structure. Specifically, laminated are a layer of copper phthalocyanine (CuPc) with a thickness of 20 nm as a hole injection layer, a layer of 4,4'-bis[N-(1-naphtyl)-N-phenyl-amino]-biphenyl (hereinafter referred to as α-NPD) with a thickness of 40 nm as a hole transport layer, a layer of $Alq_3$ doped with quinacridone (DMQd) with a thickness of 37.5 nm as a light emitting layer, a layer of $Alq_3$ with a thickness of 37.5 nm as an electron transport layer, and a layer of $CaF_2$ with a thickness of 1 nm as an electron injection layer.

Each of the cathodes 207 and 208 is formed of a film of Al having a thickness enough to transmit light. In FIG. 6, Al is heated by means of resistance heating and vaporized to be deposited in a film having a thickness of 20 nm.

It is to be noted that polythiophene (PEDOT) may be used in place of CuPc as a hole injection layer. The laminated structure and the thickness of the light emitting element described in this embodiment mode are just examples and not limited to them. In order to obtain light from the cathode side, an ITO to which Li is added so as to lower the work function may be utilized instead of thinning the film. Any light emitting element may be used in FIG. 6 as long as it is capable of emitting light from both of the anode side and the cathode side.

The light emitting element 201 in FIG. 6 includes a reflective film (or shielding film) 210 placed in contact with the cathode 207. The reflective film 210 turns a light emitted from the light emitting element 201 in the direction of the element substrate as shown by an outline arrow. It is to be noted that the reflective film 210 is formed by depositing a metal film. In the case of using the shielding film instead of the reflective film, a resin to which black pigment is added and the like can be utilized. In either case, an element such as a reflective film or a shielding film is provided so that a light emitted from the light emitting element 201 turns only in the direction of the element substrate.

The light emitting element 202 in FIG. 6 has a metal film 211 which is formed on the element substrate to be opposite the light emitting element 202 and which reflects a light emitted from the light emitting element 202. The metal film 211 turns a light emitted from the light emitting element 202 in the opposite direction to the element substrate as shown by an outline arrow. It is to be noted that the metal film 211 can be made of the same metal film as that of gate electrodes of TFTs or wirings formed in the thin film integrated circuit. Furthermore, instead of the metal film 211, a shielding film which does not reflect light but merely shields light may be provided. The shielding film may be formed of an insulating film which is used for an interlayer insulating film and to which black pigment is added. In either case, an element such as a reflective film or a shielding film which is capable of controlling the direction of light is provided so that a light emitted from the light emitting element 202 turns only in the opposite direction to the element substrate.

In this manner, the light emitting elements each of which emits light in the opposite direction to each other can be provided in the same layer. It is to be noted that the manufacturing method and the structure of the light emitting elements having the opposite direction of light are not limited to the example shown in FIG. 6. However, it is preferable that a shielding film and a reflective film are placed as near to the light emitting element as possible in order to control the directionality of light more accurately.

Although a plurality of thin film integrated circuits are stacked in this embodiment mode, a flat panel display formed of semiconductor elements may be stacked on a thin film integrated circuit. In the case of transferring the flat panel display to the thin film integrated circuit, the transfer is desirably performed before completing a display element. When forming a light emitting device using an OLED, for example, transferring is performed after forming a pixel electrode, and then an electro-luminescent layer, a cathode or the like are formed and the light emitting device is sealed. Meanwhile, when forming a liquid crystal display, transferring is performed after forming an alignment film on a pixel electrode and rubbing, then, the liquid crystal display is sealed with a counter substrate having a counter electrode and liquid crystal is injected.

As described above, a thin film chip on each layer can be formed individually according to the invention. Therefore, a manufacturing step of a semiconductor element on the upper layer is not restricted due to the heat resistance of a semiconductor element on the lower layer, thus, a semiconductor element with higher performance can be obtained. Further, a thin film chip on each layer can be stacked without a glass substrate or the like interposed therebetween and be placed in contact with each other, hence, it is not necessary to take into account the diffusion of light due to the glass substrate. In addition, since the distance between a light emitting element and a light receiving element can be made shorter, it is possible to control the directionality of light to some extent.

When forming a semiconductor device by using the thin film integrated circuit of the invention, an area occupied by the integrated circuit can be made larger, thus, a semiconductor device with higher performance can be realized while securing the reduction in weight and size. Specifically, as the usability is dramatically improved by reducing the weight and size, it is very useful to apply the thin film integrated circuit of the invention to a portable semiconductor device.

The optical interconnect allows the data transmission between thin film chips while reducing unnecessary radio wave radiation and skew caused by the wiring resistance. In addition, in the step of converting an electric signal to an optical signal and reconverting the optical signal to an electric signal, amplitude of electric signals obtained at the end can be freely controlled.

Embodiment

Embodiments of the invention will be described hereinafter.

Embodiment 1

In this embodiment, explanation is made on an example of forming a microprocessor by the use of a CPU (Central Processing Unit) formed of a plurality of thin film chips.

A TFT formed on a glass substrate operates at a lower rate as compared with a single crystalline transistor. Therefore, in the case of forming a CPU on a glass substrate, when the process contents become complex, it is difficult for a single CPU to carry out the processing at an adequate rate. To solve such problem, a series of processing steps of the CPU are divided into several steps in accordance with each purpose, and a CPU formed of one thin film chip is assigned to each processing step. Then, by interconnecting each thin film chip to each other by optical interconnect, a series of processing steps can be performed as is the case of using a single CPU. Each CPU formed of a thin film chip has only to perform the assigned processing step, thus, the operating rate is enhanced as compared with in performing all processing steps by a single CPU.

Figure 7:
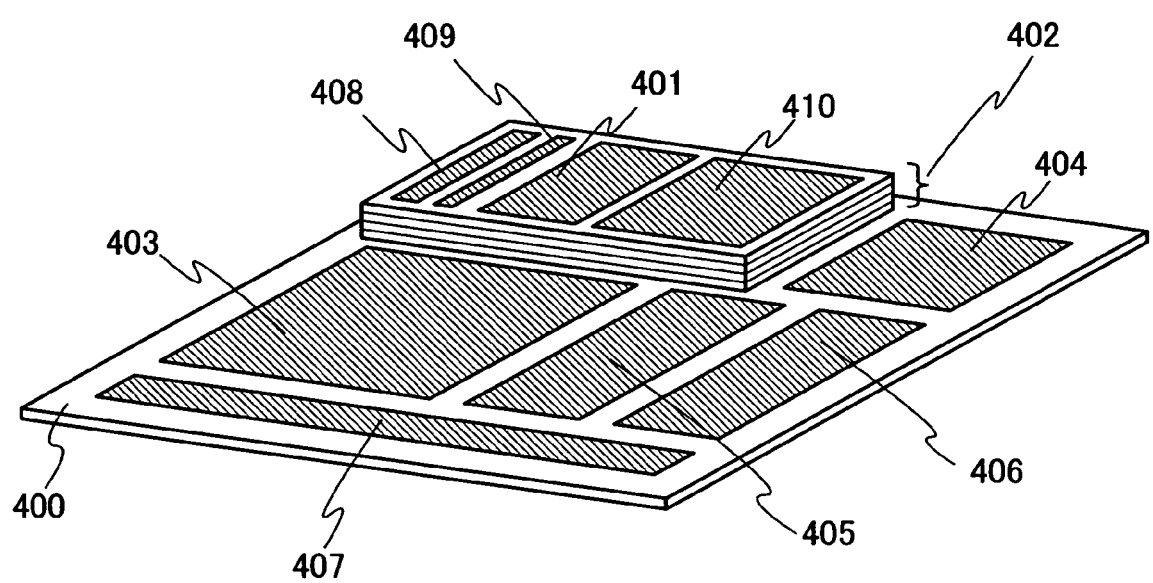
FIG. 7 shows a structure of a microprocessor using a thin film integrated circuit of the invention.

FIG. 7 is a perspective view of a microprocessor according to this embodiment. The microprocessor in FIG. 7 includes a substrate 400, and on the substrate 400 formed are a plurality of thin film chips 402 each including a CPU 401, a main memory 403, a clock controller 404, a cache controller 405, a serial interface 406, an I/O port 407 and the like. Needless to say, the microprocessor in FIG. 7 is just a simplified example and actually, a microprocessor may have various types of configurations in accordance with the intended use.

Each of the thin film chips 402 includes an optical transmitting portion 408, an interface 409, the CPU 401, and a cache memory 410. In accordance with a substrate, the optical transmitting portion 408 may have both of or either of a light emitting element, which converts an electric signal to an optical signal to be outputted, and a light receiving element, which converts an optical signal to an electric signal. Moreover, not all the light emitting elements or the light receiving elements are necessarily placed in the optical transmitting portion 408, and some of them may be placed between other circuit elements. Signals or a power supply voltage are transmitted and received between the thin film chips 402 or between the thin film chips 402 and the other circuits formed on the substrate 400 by optical transmission. It is to be noted that not all the signals and the power supply voltage are transmitted and received by optical transmission, and some of them may be transmitted and received directly by using electric signals. In such case, a terminal has to be provided in order to directly transmit and receive electric signals without converting them to optical signals.

The cache memory 410 is a memory intervening between the CPU 401 and the main memory 403, which has a small capacitance and operates at a high rate. In order to obtain a CPU capable of operating at a high rate, required is a memory capable of operating at a high rate enough to accommodate the CPU operation. However, it is in general very expensive to utilize a high-speed and large-capacitance memory which has an access time corresponding to the operating speed of the CPU. By accessing the cache memory, the CPU is capable of operating at a high rate without depending on the operating rate of the main memory.

An example of the operation of each CPU 401 is described hereinafter. First, in the initial run time, programs are downloaded into the cache memory 410 (SRAM) of each of the thin film chips 402 from the main memory 403 or the other memories externally attached. It may be performed by the CPU 401 which serves as the master.

Next, each CPU 401 which serves as a slave executes the programs stored in the cache memory 410 of the relevant thin film chip 402. The cache memory 410 of the relevant thin film chip 402 not only stores the programs but also functions as a work region, and temporarily stores calculation results and the like of the CPU 401.

When each CPU 401 requires data transmission with the output results of the other CPUs 401 or with the main memory 403, the transmission is performed via the optical transmitting portion 408. The operating rate as a whole is enhanced in accordance with an increase in the number of the CPUs 401. In particular, in the case where the number of signal transmission between the CPUs 401 or to the external of the substrate 400 is small, the advantageous effect of parallelization is expected.

As an example of programs, in the optimizing problem (e.g., the problem of automatic wiring, the problem of the way in which a salesman goes around and the like) such that the minimum value is attempted to find out within a phase space having a very large number of minimal values, and in the evaluation of variation (circuit simulation and the like), the cases where methods such as Monte Carlo method, simulated annealing and the like are applied are listed.

These programs fundamentally and independently have configurations for executing the same subprogram many times, and the complete program can be substantially executed in the CPU 401 and the cache memory 410 within each thin film chip 402 by making the different CPUs 401 account for each subprogram, thus, an ideal parallel computation is performed.

It is to be noted that since the inconvenience may occur in viewing the processing as a whole when the operating rate between the CPUs varies, the balance of the operating rate between each CPU which serves as a slave may be adjusted by means of the CPU which serves as the master.

Embodiment 2

The thin film integrated circuit according to the invention can be applied to various types of memories. By stacking memories, the capacitance of the memories can be enlarged while reducing the packaging area. In addition, by transmitting and receiving data between each thin film chip by means of optical transmission, the number of pins used for packaging can be reduced even in stacking the memories.

As a memory to be stacked, a RAM (volatile memory) as typified by an SRAM (Static Random Access Memory), a DRAM (Dynamic Random Access Memory) or the like, and a ROM (non-volatile memory) typified by a mask ROM, an EPROM (Erasable Programmable Read Only Memory), an EEPROM (Electrically Erasable Programmable ROM), a flash memory, a ferroelectric memory or the like can be utilized. Also, these memories may be combined to be stacked.

When stacking memories, a R/W (Read/Write) circuit for selecting reading or writing, a pre-charge circuit, a control circuit (refresh circuit) for refreshing or the like may be provided in a thin film chip of the relevant memory in accordance with types or specifications of the memory. In addition, a power supply voltage to be supplied may be adjusted in accordance with each thin film integrated circuit so as to be optimized.

A DRAM is taken for example in this embodiment, and a configuration of a memory formed by stacking DRAMs will be described.

Figure 8A:
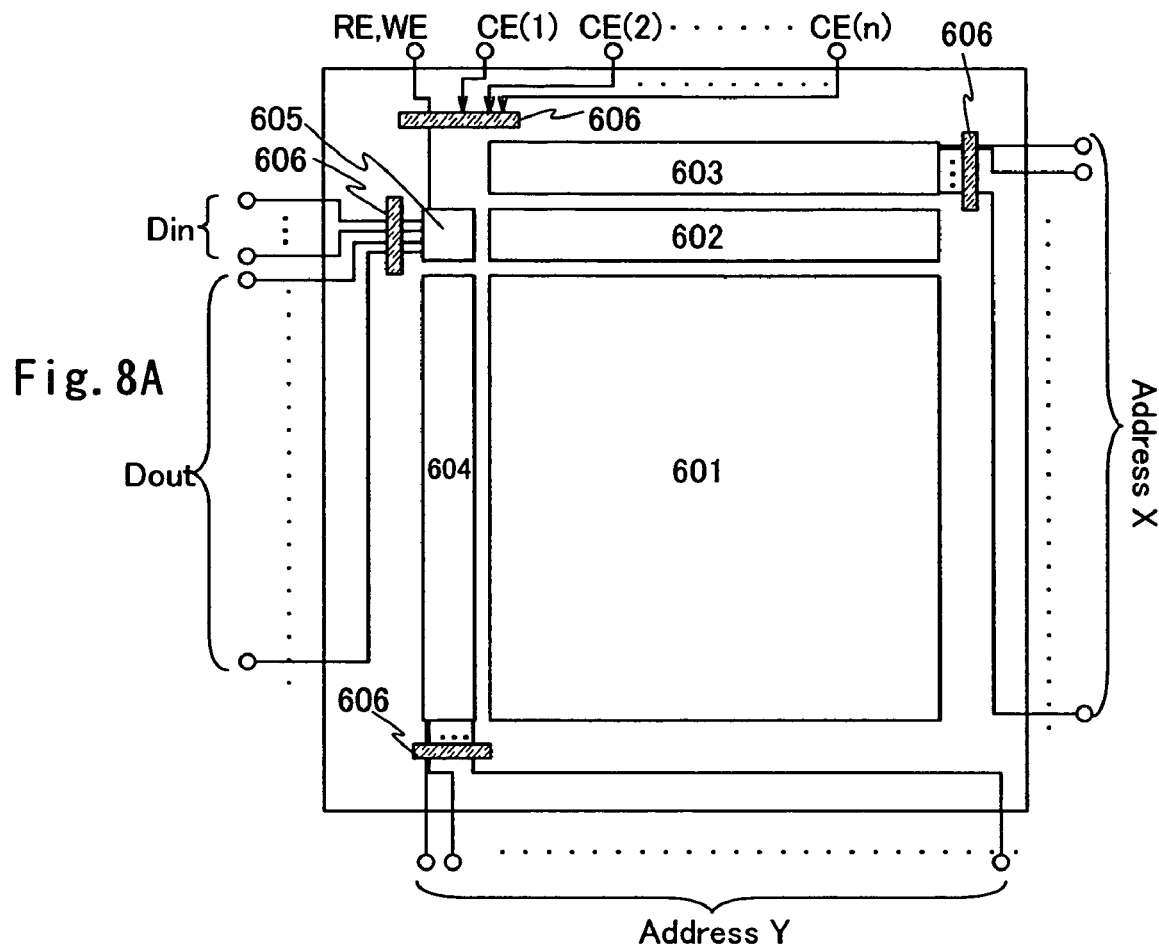
FIGS. 8A and 8B show configurations of a DRAM using a thin film integrated circuit of the invention.

FIG. 8A shows a configuration of a thin film chip on the first layer. The thin film chip shown in FIG. 8A includes a memory cell array 601 of a DRAM, a selector circuit 602, a column decoder 603, a row decoder 604, an R/W circuit 605, and optical transmitting portions 606.

The memory cell array 601 includes a plurality of memory cells. A memory cell is selected by the selector circuit 602, which is controlled by signals from the column decoder 603, and by the row decoder 604 to read and write data.

Figure 8B:
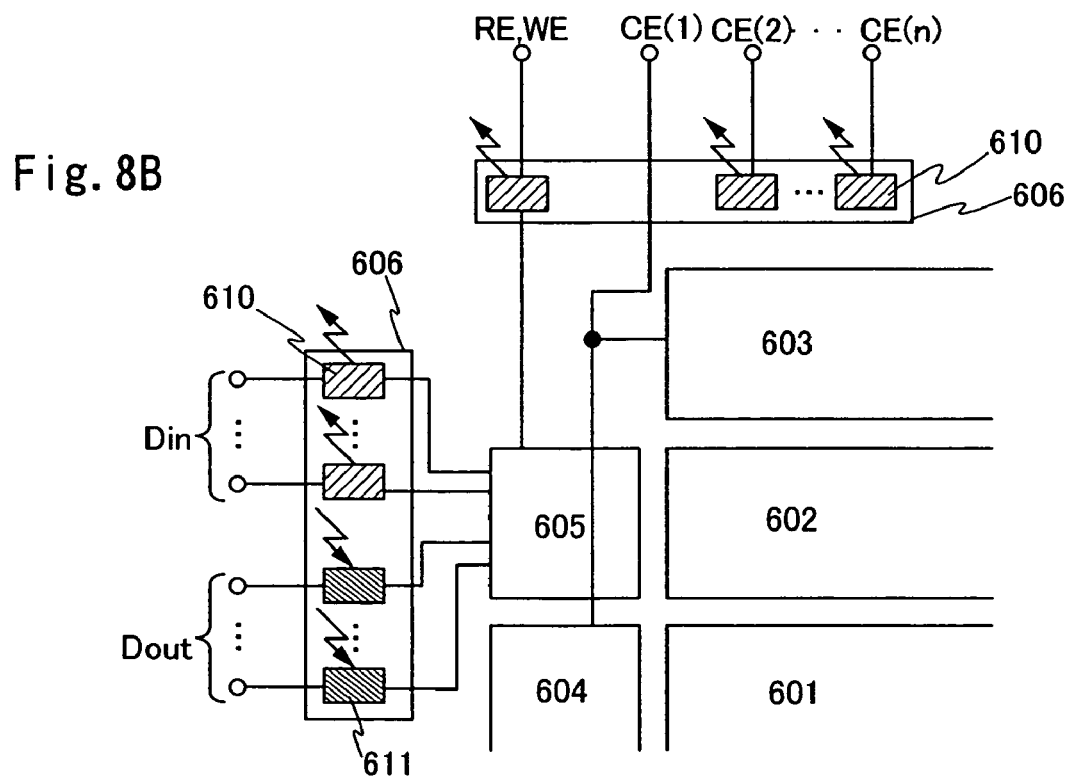

Transmitting and receiving signals between a connecting terminal and the thin film chip on the first layer are performed directly by using electric signals or via the optical transmitting portions 606. FIG. 8B is an enlarged view of the optical transmitting portions 606. The optical transmitting portions 606 include a light emitting element 610 and a light receiving element 611. Various types of signals inputted from the connecting terminal and electric signals outputted from the thin film chip on the first layer are converted to optical signals in the light emitting element 610 and transmitted to a thin film chip on the kth layer (k is a natural number equal to or more than 2). Meanwhile, optical signals transmitted from a thin film chip on the kth layer are converted to electric signals in the light receiving element 611 and transmitted to the thin film chip on the first layer or the connecting terminal.

With reference to the signals inputted to the optical transmitting portions 606, CE (Chip enable) (1) to CE (n) correspond to signals for selecting one or a plurality of thin film chips on the first to the nth layers. Electric signals inputted to the optical transmitting portions 606 via the connecting terminal, that is, RE (Read enable), WE (Write enable) and Din are converted to optical signals in the light emitting element 610 and transmitted to a thin film chip selected by a signal CE. On the other hand, optical signals transmitted from a thin film chip selected by a signal CE are converted to electric signals in the light receiving element 611 on the first layer and outputted as a signal Dout via the connecting terminal.

In this embodiment, RE and WE are signals for selecting either of reading or writing of data performed by the R/W circuit 605, Din is a signal including data to be written in the memories as information, and Dout is a signal including data to be outputted from the memories as information.

Figure 9:
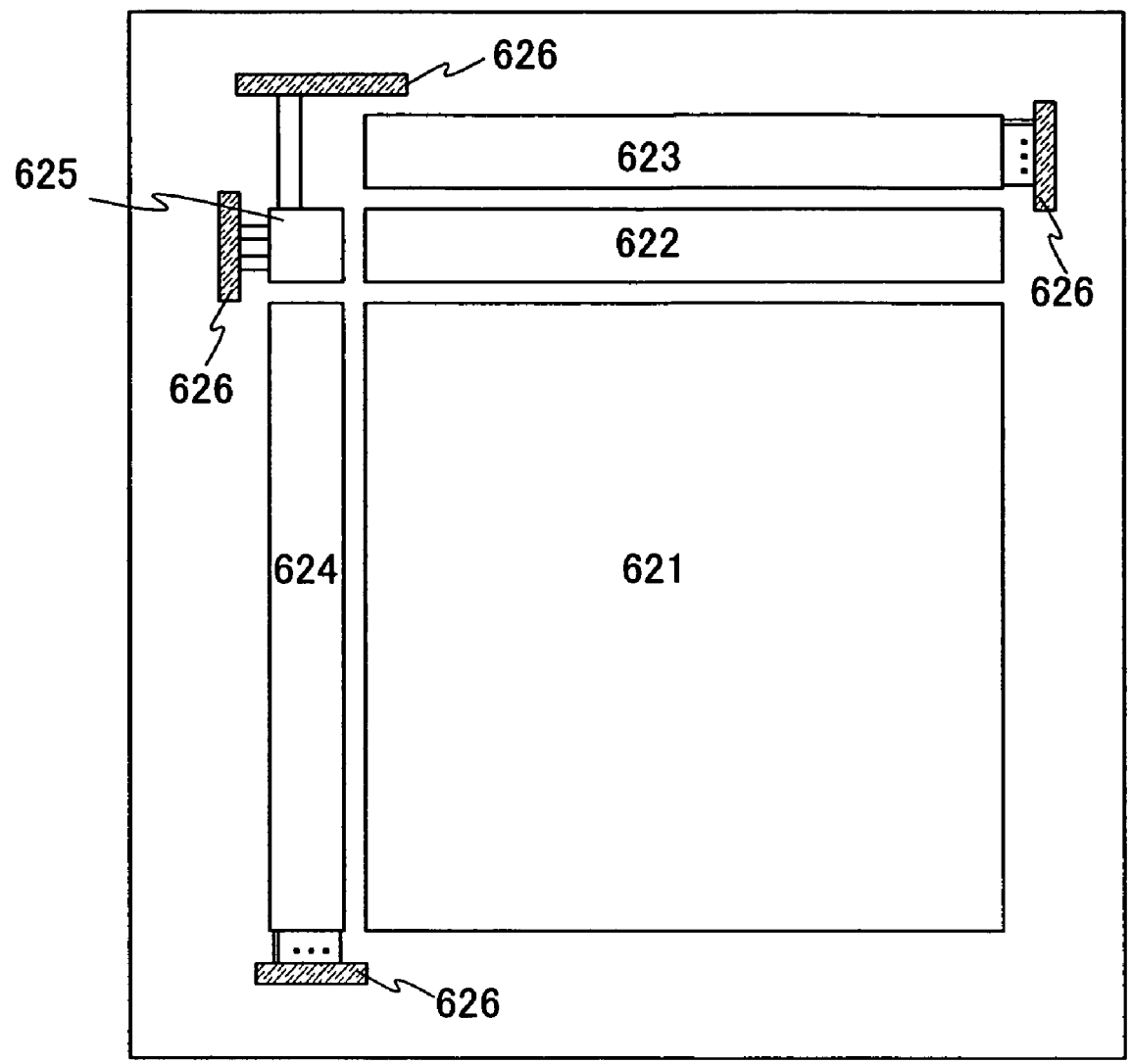
FIG. 9 shows a configuration of a DRAM using a thin film integrated circuit of the invention.

FIG. 9 shows a configuration of a thin film chip on the kth layer. In this embodiment, a DRAM is formed in the thin film chip on the kth layer as well as in the thin film chip on the first layer. The thin film chip on the kth layer shown in FIG. 9 includes a memory cell array 621 on the kth layer, a selector circuit 622 corresponding to the memory cell array 621, a column decoder 623, a row decoder 624, an R/W circuit 625, and optical transmitting portions 626.

Although not shown, the optical transmitting portions 626 include both of or either of a light emitting element and a light receiving element, and transmitting and receiving signals between the thin film chips on the other layers are performed in the optical transmitting portion 626.

It is to be noted that DRAMs are formed in the thin film chips on both the first and the kth layers in this embodiment, though the invention is not limited to this configuration. Any kind of semiconductor memories can be formed in the thin film chips and the thin film chips can be stacked. Moreover, circuits for driving memories are not limited to the circuits described in this embodiment.

Electric signals are inputted to the thin film chip on the first layer via the connecting terminal in this embodiment, however, the invention is not limited to this and the electric signals may be inputted to a thin film chip on the second layer or the sequential layers via the connecting terminal.

Embodiment 3

In this embodiment, a configuration of a one-chip microcomputer formed of a plurality of thin film chips will be described.

Figure 10:
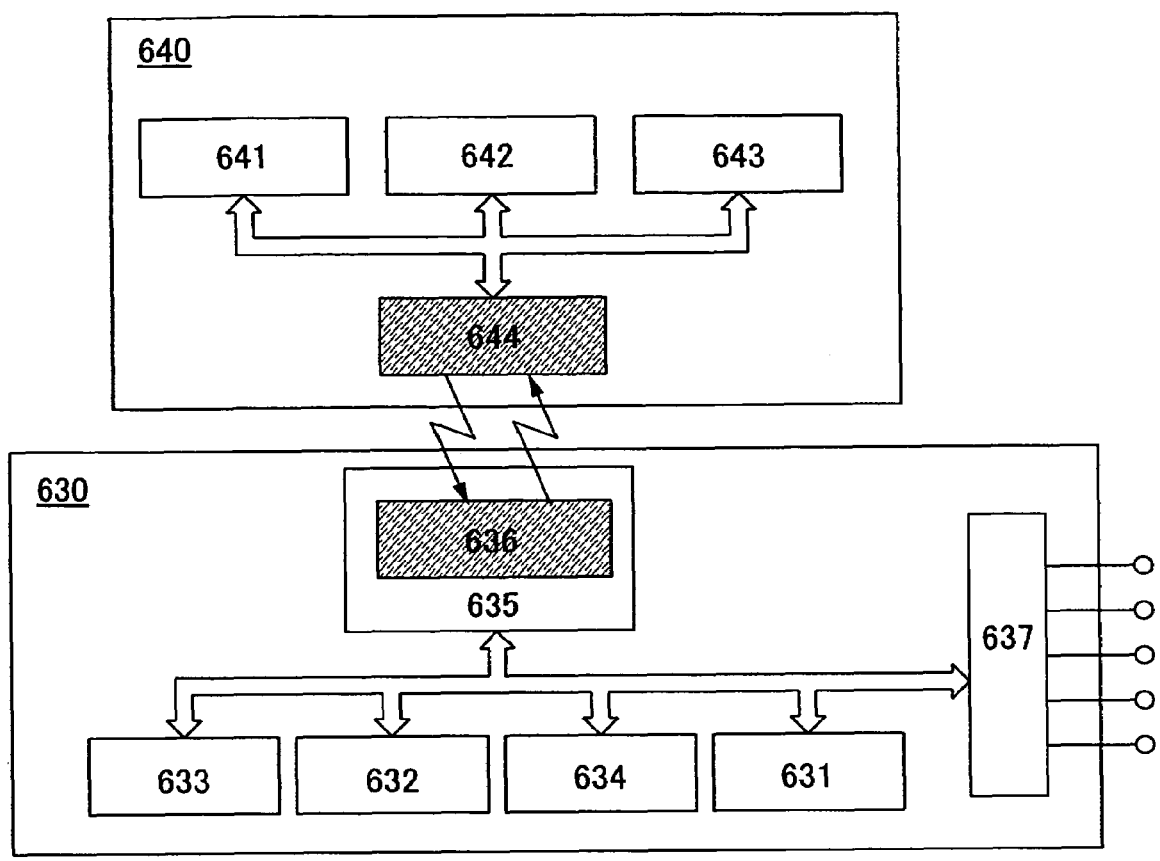
FIG. 10 shows a configuration of a one-chip microcomputer using a thin film integrated circuit of the invention.

FIG. 10 shows a block diagram of a microprocessor according to the invention. The microprocessor of the invention is formed of two layers of thin film chips. A thin film chip 630 on the first layer includes an SIO (Serial Input/Output) 631, an MMU (Memory Management Unit) 632, a counter 633, a DAC (Digital to Analog Converter) 634, a bus controller (bus interface) 635, an optical transmitting portion 636, and an input/output port 637. A thin film chip 640 on the second layer includes a CPU 641, a RAM 642, a ROM 643, and an optical transmitting portion 644.

The optical transmitting portions 636 and 644 each include a light emitting element and a light receiving element, and in the optical transmitting portions 636 and 644, various kinds of signals and power supply voltages are transmitted and received by optical transmission.

As described in this embodiment, by forming the microprocessor with the stacked thin film chips, a packaging area of the microcomputer can be considerably reduced in size.

Embodiment 4

Explanation will be hereinafter made on how to electrically connect an interposer and a thin film chip.

Figure 11:
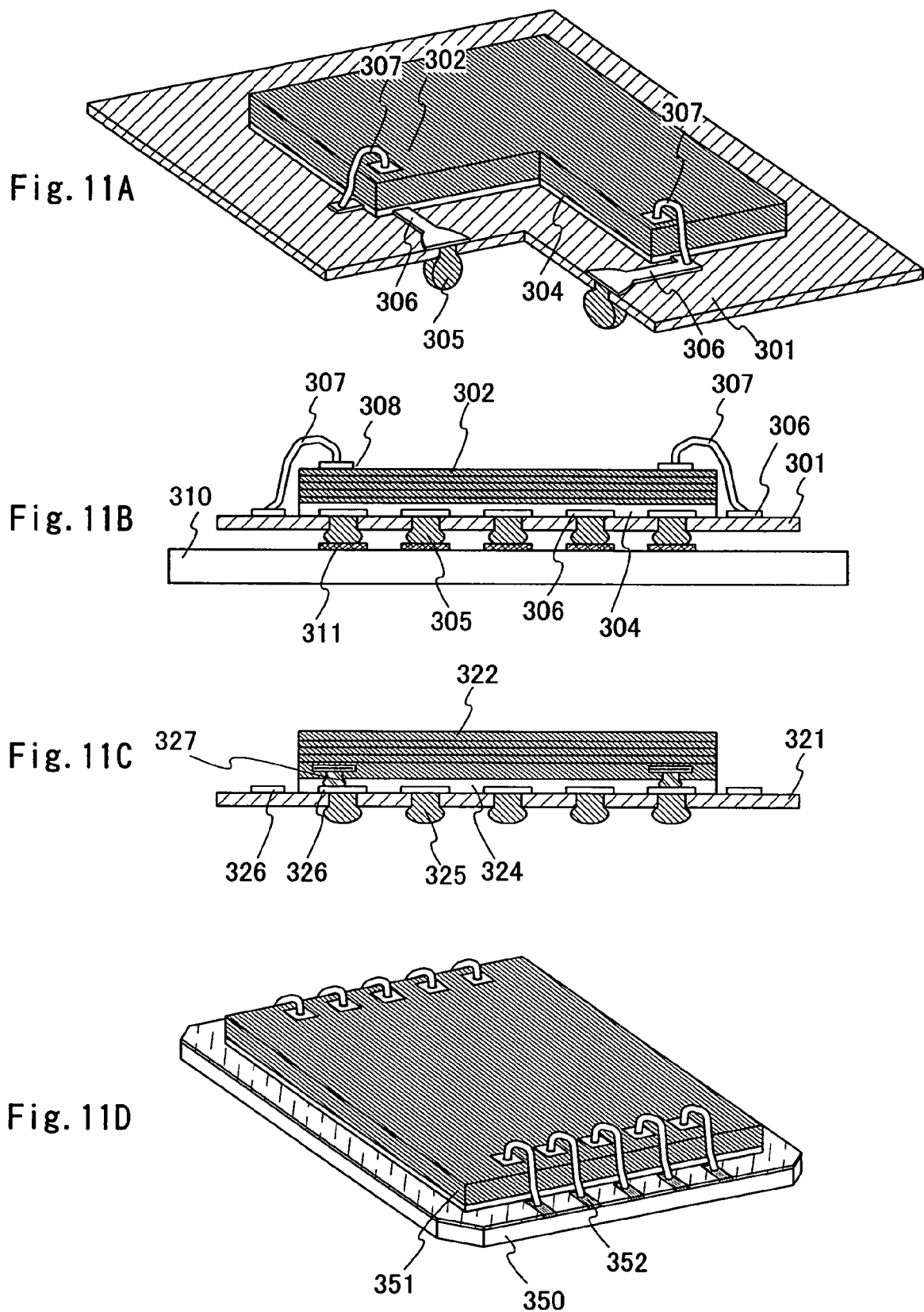
FIGS. 11A to 11D are perspective views and cross-sectional views showing a thin film integrated circuit of the invention connected to an interposer.

FIG. 11A is a perspective view of a cross section showing a stacked thin film chip connected to an interposer by wire bonding. Reference numeral 301 denotes an interposer and 302 denotes a stacked thin film chip. The thin film chip 302 is attached on the interposer 301 with an adhesive 304.

The interposer 301 shown in FIG. 11A is a ball grid array in which a solder ball 305 is provided. The solder ball 305 is formed on the opposite surface of the interposer 301 on which the thin film chip 302 is attached. A wiring 306 provided on the interposer 301 is electrically connected to the solder ball 305 via contact holes provided in the interposer 301.

Although the wiring 306 for electrically connecting the thin film chip 302 and the solder ball 305 is provided on the surface of the interposer 301 on which the thin film chip 302 is attached, the invention is not limited to this structure. The wiring may be laminated within the interposer for example.

In FIG. 11A, the wiring 306 is electrically connected to the thin film chip 302 with a wire 307. FIG. 11B is a cross-sectional view of the package shown in FIG. 11A. A semiconductor element is formed on the thin film chip 302, and a pad 308 is provided on the opposite surface of the thin film chip 302 to which the interposer 301 is attached. In this embodiment, the pad 308 is electrically connected on the top layer of the stacked thin film chip 302, and connected to the wiring 306 provided on the interposer 301 with the wire 307.

Reference numeral 310 denotes a part of a printed wiring board and 311 denotes a wiring or electrode provided on the printed wiring board 310. The wiring 306 is connected to the wiring or electrode 311 provided on the printed wiring board 310 via the solder ball 305. The wiring or electrode 311 can be connected to the solder ball 305 by thermocompression bonding, ultrasonic bonding and the like. It is to be noted that an underfill material may be dispensed between the solder ball and the wiring or electrode after the compression so as to improve the mechanical strength of the connecting portion and enhance the heat diffusion evolved in the package. Although the underfill material is not necessarily employed, it can prevent connection failure due to stress derived from a mismatch of coefficient of thermal expansion between the interposer and the thin film chip. In the case of ultrasonic bonding, the connection failure can be suppressed as compared with in the case of thermocompression bonding. In particular, ultrasonic bonding is useful when using approximately 300 or more solder balls to be connected.

FIG. 11C is a cross-sectional view in the case where a thin film chip 322 is connected to an interposer 321 by flip chip bonding. In FIG. 11C, a solder ball 327 is provided on the surface of a thin film chip on the bottom layer to which the interposer 321 is attached, and electrically connected to the thin film chip on the bottom layer.

The solder ball 327 is connected to a wiring 326 provided on the interposer 321. Additionally in FIG. 11C, an underfill 324 serving as an adhesive is provided so as to fill a gap between the solder balls 327. A solder ball 325 is provided on the opposite surface of the interposer 321 to which the thin film chip 322 is attached. The wiring 326 provided on the interposer 321 is electrically connected to the solder ball 325 via a contact hole provided in the interposer 321.

In the case of flip chip bonding, as compared with in the case of wire bonding, the pitch between pads to be interconnected can be widened even when the number of pads is increased. Therefore, thin film chips having many terminals are preferably interconnected by flip chip bonding.

The thin film chips shown in FIGS. 11A to 11C are transferred to a ball grid array interposer, though the invention is not limited to this. A lead frame interposer in which terminals are arranged in the peripheral region may be employed instead. FIG. 11D is a perspective view of a cross section in the case where a lead frame interposer is employed.

In FIG. 11D, a thin film chip 351 is connected to a connecting terminal 352 provided on an interposer 350 by wire bonding. The connecting terminal 352 is provided on the surface of the interposer 350 to which the thin film chip 351 is attached.

It is to be noted that although the thin film chip is exposed in this embodiment, it may be covered with a molding resin.

Further, the invention is not necessarily limited to the configuration shown in this embodiment in which the thin film chip is formed on the interposer. The thin film chip may be formed on a known substrate used for forming a semiconductor integrated circuit, e.g., a glass substrate, a quartz substrate, a silicon substrate, a plastic substrate or the like. In this case, an external signal or a power supply voltage may be supplied by using a connecting terminal provided on a substrate, or may be supplied by optical transmission.

Embodiment 5

A plurality of fabrication systems are required for the steps of transferring the thin film chip according to the invention. Therefore, in-line manufacturing equipment in which substrates are automatically transported between the systems is utilized so as to enhance the manufacturing efficiency.

Figure 12:
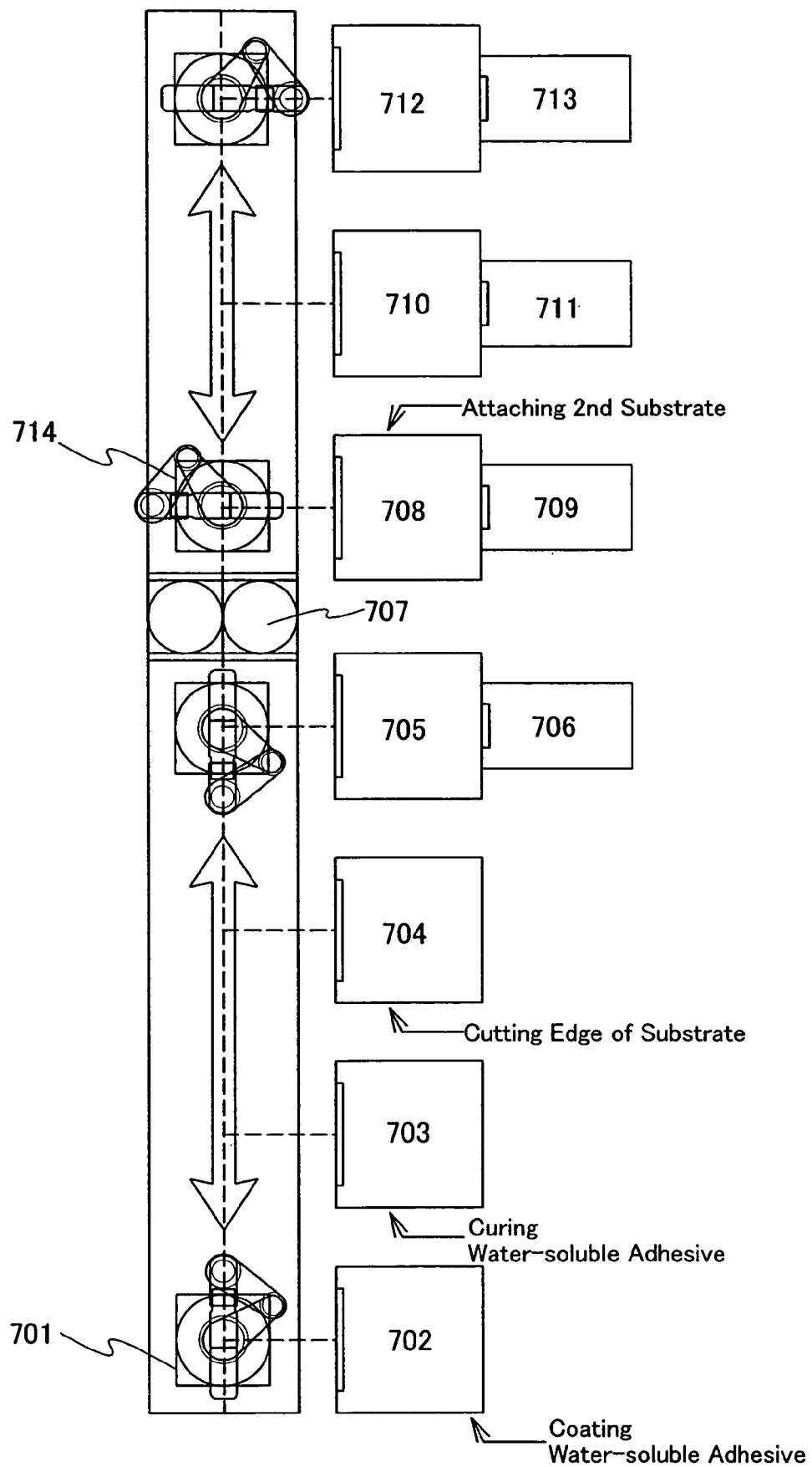
FIG. 12 shows an example of production equipment used in the manufacturing steps of a thin film integrated circuit of the invention.

FIG. 12 shows a structure of in-line manufacturing equipment in which the transport of substrates between fabrication systems is automated. According to this in-line manufacturing equipment, the transport of substrates in the manufacturing steps described in Embodiment Mode with reference to FIGS. 1A to 1E, FIGS. 2A to 2D, and FIGS. 3A and 3B is automated, namely from the step for the attachment of the second substrate to the first substrate on which semiconductor elements are formed to the step for the attachment of the third substrate.

In FIG. 12, reference numerals 701 and 714 denote systems for transporting a substrate (substrate transport systems), and these systems move in the direction shown by outline arrows. Reference numeral 707 denotes a substrate transfer station for temporarily keeping a substrate to be transferred between the substrate transport systems 701 and 714.

Although the substrate transport between each system is performed with the two substrate transport systems 701 and 714 in this embodiment, the invention is not limited to this. By increasing the number of the substrate transport systems, it is possible to improve the efficiency of the substrate transport. Moreover, a system for temporarily keeping a substrate to be transferred such as the substrate transfer station 707 is not necessarily provided. For example, a substrate transport system for carrying a substrate in a system may be provided separately from a substrate transport system for carrying a substrate out so as to transfer the substrates.

Reference numeral 702 denotes a spinner used for spin-coating a water-soluble adhesive so as to cover semiconductor elements on the first substrate. Reference numeral 703 denotes an exposure system used for exposing the adhesive coated by the spinner 702 to UV rays so as to be cured. Reference numeral 704 denotes a scriber used for cutting the edge of a substrate so as to facilitate the detachment of semiconductor elements on the border of a metal oxide film in a removing step.

Reference numeral 705 denotes a two-sided tape attachment system used for attaching a two-sided tape supplied by a tape supply cassette 706 to the surface of the first substrate on which the adhesive is coated. Reference numeral 708 denotes a substrate attachment system used for attaching the second substrate supplied by a substrate supply cassette 709 to the first substrate with the two-sided tape attached in the preceding step.

Reference numeral 710 denotes a two-sided tape attachment system used for attaching a two-sided tape supplied by a tape supply cassette 711 to the opposite surface of the first substrate on which the adhesive is coated. Reference numeral 712 denotes a substrate attachment system used for attaching the third substrate supplied by a substrate supply cassette 713 to the first substrate with the two-sided tape attached in the preceding step.

It is to be noted that the manufacturing equipment is not limited to the above-described structure, but the other systems used for the other steps may also be in-lined in the manufacturing equipment in addition to the systems described above.

Embodiment 6

The thin film integrated circuit according to the invention can be applied to various types of semiconductor devices. Also, a display device can be attached to the thin film integrated circuit of the invention and to manufacture an electronic equipment. Specifically, as the usability is dramatically improved by reducing the weight and size, it is very useful to apply the thin film integrated circuit of the invention to a portable electronic equipment.

FIG. 13A shows a sheet mobile phone including a main body 2101, a display portion 2103, an audio input portion 2104, an audio output portion 2105, a switch 2106, an external connection port 2107 and the like. An earphone 2108 prepared separately can be connected to the sheet mobile phone via the external connection port 2107. For the display portion 2103, a touch panel display device provided with a sensor is employed, and a series of operations can be performed by touching a touch panel operation key 2109 displayed on the display portion 2103. The thin film integrated circuit according to the invention can be employed for various types of signal processing circuits provided in the main body 2101. Further, when a display device is attached to the thin film integrated circuit, the display device can be employed for the display portion 2103.

FIG. 13B shows an electronic book including a main body 2201, a display portion 2202, an operation key 2203 and the like. A modem may also be built into the main body 2201. The thin film integrated circuit according to the invention can be employed for various types of signal processing circuits.

FIG. 13C shows a watch including a main body 2301, a display portion 2302, a clamp 2303 and the like. The thin film integrated circuit according to the invention can be employed for various types of signal processing circuits provided in the main body 2301. When a display device is attached to the thin film integrated circuit, the display device can be employed for the display portion 2302.

FIG. 13D shows a sheet personal computer including a main body 2401, a display portion 2402, a touch panel keyboard 2403, a pointing mouse 2404, an external connection port 2405, a power supply plug 2406 and the like. A touch panel display device provided with sensor is used for the touch panel keyboard 2403 and the pointing mouse 2404. Accordingly, a series of operations can be performed by touching the touch panel keyboard 2403 and the pointing mouse 2404. The thin film integrated circuit according to the invention can be employed for various types of signal processing circuits. When a display device is attached to the thin film integrated circuit, the display device can be employed for the display portion 2402, the touch panel keyboard 2403 and the like.

FIG. 13E shows an electronic card including a main body 2601, a display portion 2602, a connecting terminal 2603 and the like. The thin film integrated circuit according to the invention can be employed for various types of signal processing circuits provided in the main body 2601. When a display device is attached to the thin film integrated circuit, the display device can be employed for the display portion 2602.

As described above, the application range of the invention is so wide that the invention is applicable to an electronic equipment of all fields. The electronic equipment according to this embodiment can be formed of a thin film integrated circuit having any one of configurations described in Embodiments 1 to 5.

Embodiment 7

Explanation will be made on a method for realizing a full color display device by stacking display devices each using an OLED as a display element in this embodiment.

Figure 14A:
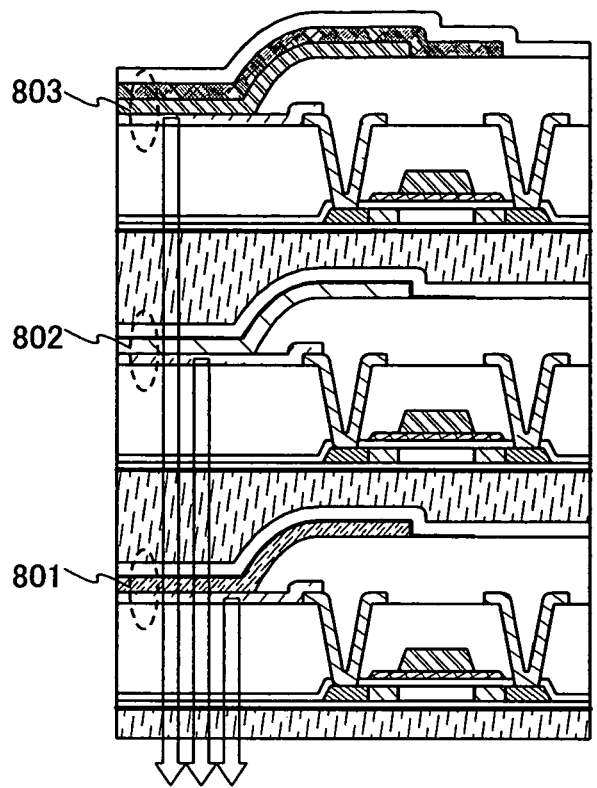
FIGS. 14A and 14B are cross-sectional views of a pixel of a display device which is one of the semiconductor devices of the invention.

FIG. 14A is a cross-sectional view of a pixel included in the display device according to the invention. Reference numeral 801 denotes an OLED provided in a thin film chip on the first layer, and the OLED 801 emits red light (R) in this embodiment. Reference numeral 802 denotes an OLED provided in a thin film chip on the second layer, and the OLED 802 emits blue light (B) in this embodiment. Reference numeral 803 denotes an OLED provided in a thin film chip on the third layer, and the OLED 803 emits green light (G) in this embodiment.

The OLEDs 801 to 803 are provided in each pixel and arranged so that their light emitting areas overlap each other and an observer can see the overlapped light emission. The colors of the OLEDs provided in the thin film chip on each layer are not limited to the above-described combination.

In order to turn all the lights emitted from the OLEDs 801 to 803 in the direction of the thin film chip on the bottom layer, a cathode of the OLED 803 provided in the thin film chip on the top layer is formed of a light reflective material, and two electrodes of each of the OLEDs 801 and 802 is formed so as to have a structure capable of transmitting a light.

According to the structure described above, a full color display device using an OLED as a display element can be obtained.

Hereinafter shown is a cross-sectional view of a display device according to the invention having a structure different from that shown in FIG. 14A.

Figure 14B:
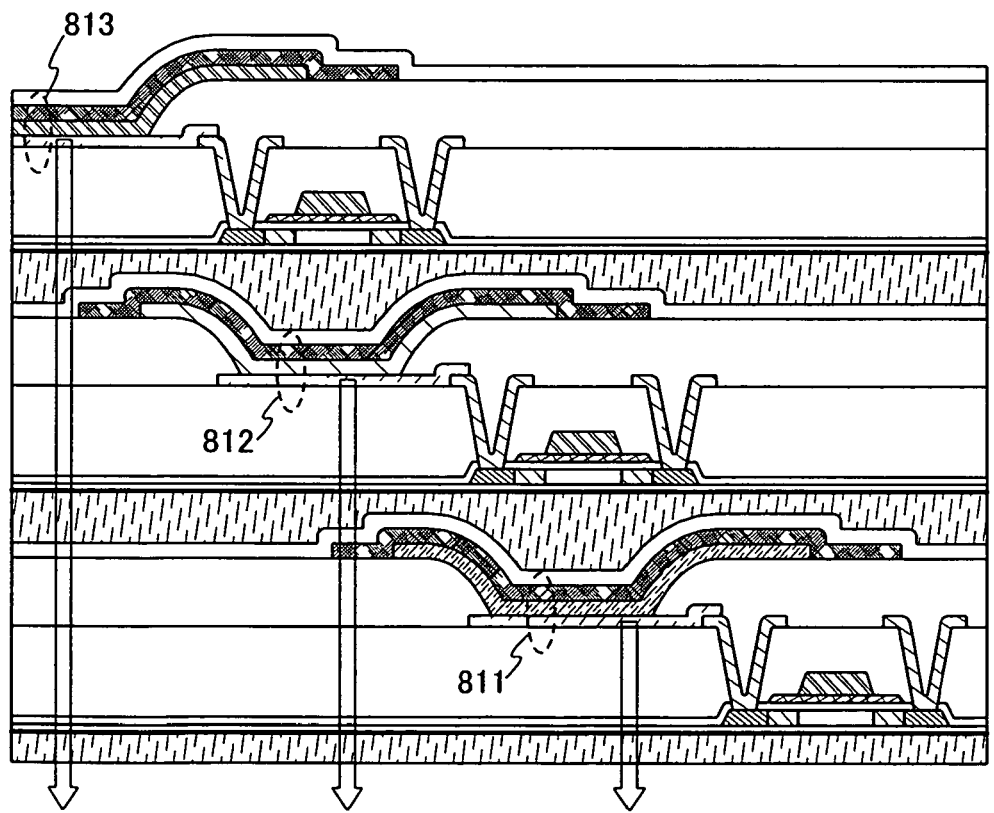

In FIG. 14B, reference numeral 811 denotes an OLED provided in a thin film chip on the first layer, and the OLED 811 emits red light (R) in this embodiment. Reference numeral 812 denotes an OLED provided in a thin film chip on the second layer, and the OLED 812 emits blue light (B) in this embodiment. Reference numeral 813 denotes an OLED provided in a thin film chip on the third layer, and the OLED 813 emits green light (G) in this embodiment.

The OLEDs 811 to 813 are provided in each pixel and arranged so that their light emitting areas do not overlap or partially overlap each other if any. The colors of the OLEDs provided in the thin film chips on each layer are not limited to the above-described combination.

In order to turn all the lights emitted from the OLEDs 811 to 813 in the direction of the thin film chip on the bottom layer, each cathode of the OLEDs 811 to 813 provided in the thin film chips on each layer is formed of a light reflective layer.

According to the above-described structure, a full color display device using an OLED as a display element can be obtained.

The display device described in this embodiment is manufactured by separately forming each thin film chip. Therefore, a manufacturing method can be easily optimized for each thin film chip. It is thus possible to optimize the structure of each OLED having different colors in accordance with the used electro-luminescent material, and to appropriately change the manufacturing method in accordance with the structure.

As described above, a thin film chip on each layer can be formed individually according to the invention. Hence, a manufacturing step of a semiconductor element on the upper layer is not restricted due to the heat resistance of a semiconductor element on the lower layer, thus, a semiconductor element with higher performance can be obtained. Further, a thin film chip on each layer can be stacked without a glass substrate or the like interposed therebetween and thus be in contact with each other, therefore, it is not necessary to take into account the diffusion of light due to the glass substrate. In addition, the distance between a light emitting element and a light receiving element can be made shorter, thus, it is possible to control the directionality of light to some extent.

When forming a semiconductor device by using the thin film integrated circuit of the invention, an area occupied by the integrated circuit can be made larger, thus, a semiconductor device with higher performance can be realized while securing the reduction in weight and size. Specifically, as the usability is dramatically improved by reducing the weight and size, it is very useful to apply the thin film integrated circuit of the invention to a portable semiconductor device.

The optical interconnect allows data transmission between thin film chips while reducing unnecessary radio wave radiation and skew caused by the wiring resistance. In addition, in the steps of converting an electric signal to an optical signal and reconverting the optical signal to an electric signal, amplitude of electric signals obtained at the end can be freely controlled.

What is claimed is:

1. A semiconductor device comprising:
a first semiconductor element including at least one thin film transistor;
a second semiconductor element including at least one thin film transistor;
a first insulating film and a second insulating film formed between the first semiconductor element and the second semiconductor element;
a resin film formed between and in contact with the first insulating film and the second insulating film;
a light emitting element electrically connected to the first semiconductor element; and
a light receiving element electrically connected to the second semiconductor element,
wherein the first semiconductor element and the second semiconductor element are stacked with the first insulating film, the second insulating film, and the resin film interposed therebetween,
wherein a signal is transmitted and received between the first semiconductor element and the second semiconductor element by using the light emitting element and the light receiving element,
wherein the light emitting element comprises a first electrode, a second electrode, and an electro-luminescent layer formed between the first electrode and the second electrode, and
wherein the first electrode, the electro-luminescent layer, and the second electrode are overlapped each other.

2. A semiconductor device comprising:
a first semiconductor element including at least one thin film transistor;
a second semiconductor element including at least one thin film transistor;
a resin film formed between the first semiconductor element and the second semiconductor element;

an insulating film formed between the first semiconductor element and the second semiconductor element;
a metal oxide partially formed between the first semiconductor element and the second semiconductor element wherein the resin film is interposed between the insulating film and the metal oxide; and
a light emitting element electrically connected to the first semiconductor element and
a light receiving element electrically connected to the second semiconductor element,
wherein the first semiconductor element and the second semiconductor element are stacked,
wherein a signal is transmitted and received between the first semiconductor element and the second semiconductor element by using the light emitting element and the light receiving element,
wherein the light emitting element comprises a first electrode, a second electrode, and an electro-luminescent layer formed between the first electrode and the second electrode, and
wherein the first electrode, the electro-luminescent layer, and the second electrode are overlapped each other.

3. A semiconductor device comprising:
a first semiconductor element including at least one thin film transistor;
a second semiconductor element including at least one thin film transistor;
a first insulating film and a second insulating film formed between the first semiconductor element and the second semiconductor element;
a resin film formed between and in contact with the first insulating film and the second insulating film;
a light emitting element electrically connected to the first semiconductor element; and
a light receiving element electrically connected to the second semiconductor element,
wherein the first semiconductor element and the second semiconductor element are stacked with the first insulating film, the second insulating film, and the resin film interposed therebetween,
wherein a first electric signal is converted to an optical signal in the light emitting element,
wherein the optical signal is converted to a second electric signal in the light receiving element,
wherein the light emitting element comprises a first electrode, a second electrode, and an electro-luminescent layer formed between the first electrode and the second electrode, and
wherein the first electrode, the electro-luminescent layer, and the second electrode are overlapped each other.

4. A semiconductor device comprising:
a first semiconductor element including at least one thin film transistor;
a second semiconductor element including at least one thin film transistor;
a resin film formed between the first semiconductor element and the second semiconductor element;
an insulating film formed between the first semiconductor element and the second semiconductor element;
a metal oxide partially formed between the first semiconductor element and the second semiconductor element wherein the resin film is interposed between the insulating film and the metal oxide;
a light emitting element electrically connected to the first semiconductor element and
a light receiving element, electrically connected to the second semiconductor element,
wherein the first semiconductor element and the second semiconductor element are stacked,
wherein a first electric signal is converted to an optical signal in the light emitting element,
wherein the optical signal is converted to a second electric signal in the light receiving element,
wherein the light emitting element comprises a first electrode, a second electrode, and an electro-luminescent layer formed between the first electrode and the second electrode, and
wherein the first electrode, the electro-luminescent layer, and the second electrode are overlapped each other.

5. A semiconductor device comprising:
a first semiconductor element and a second semiconductor element each including at least one thin film transistor stacked by transferring a semiconductor element formed over a different substrate;
a first insulating film and a second insulating film formed between the first semiconductor element and the second semiconductor element;
a resin film formed between and in contact with the first insulating film and the second insulating film second insulating film;
a light emitting element electrically connected to the first semiconductor element; and
a light receiving element electrically connected to the second semiconductor element,
wherein a first electric signal is converted to an optical signal in the light emitting element,
wherein the optical signal is converted to a second electric signal in the light receiving element,
wherein the light emitting element comprises a first electrode, a second electrode, and an electro-luminescent layer formed between the first electrode and the second electrode, and
wherein the first electrode, the electro-luminescent layer, and the second electrode are overlapped each other.

6. A semiconductor device comprising:
a first semiconductor element and a second semiconductor element each including at least one thin film transistor stacked by transferring a semiconductor element formed over a different substrate;
a resin film formed between the first semiconductor element and the second semiconductor element;
an insulating film formed between the first semiconductor element and the second semiconductor element;
a metal oxide partially formed between the first semiconductor element and the second semiconductor element wherein the resin film is interposed between the insulating film and the metal oxide;
a light emitting element electrically connected to the first semiconductor element; and
a light receiving element electrically connected to the second semiconductor element,
wherein a first electric signal is converted to an optical signal in the light emitting element,
wherein the optical signal is converted to a second electric signal in the light receiving element,
wherein the light emitting element comprises a first electrode, a second electrode, and an electro-luminescent layer formed between the first electrode and the second electrode, and
wherein the first electrode, the electro-luminescent layer, and the second electrode are overlapped each other.

7. A semiconductor device formed by detaching a first semiconductor element formed over a first substrate and a second semiconductor element formed over a second substrate and by stacking the first semiconductor element and the second semiconductor element over an element substrate, comprising:
- a first insulating film and a second insulating film formed between the first semiconductor element and the second semiconductor element;
- a resin film formed between and in contact with the first insulating film and the second insulating film;
- a light emitting element electrically connected to the first semiconductor element; and
- a light receiving element electrically connected to the second semiconductor element,
- wherein a first electric signal is converted to an optical signal in the light emitting element,
- wherein the optical signal is converted to a second electric signal in the light receiving element,
- wherein each of the first semiconductor element and the second semiconductor element has at least one thin film transistor,
- wherein the light emitting element comprises a first electrode, a second electrode, and an electro-luminescent layer formed between the first electrode and the second electrode, and
- wherein the first electrode, the electro-luminescent layer, and the second electrode are overlapped each other.

8. A semiconductor device formed by detaching a first semiconductor element formed over a first substrate and a second semiconductor element formed over a second substrate and by stacking the first semiconductor element and the second semiconductor element over an element substrate, comprising:
- a resin film formed between the first semiconductor element and the second semiconductor element;
- an insulating film formed between the first semiconductor element and the second semiconductor element;
- a metal oxide partially formed between the first semiconductor element and the second semiconductor element wherein the resin film is interposed between the insulating film and the metal oxide;
- a light emitting element electrically connected to the first semiconductor element; and
- a light receiving element electrically connected to the second semiconductor element,
- wherein a first electric signal is converted to an optical signal in the light emitting element,
- wherein the optical signal is converted to a second electric signal in the light receiving element,
- wherein each of the first semiconductor element and the second semiconductor element has at least one thin film transistor,
- wherein the light emitting element comprises a first electrode, a second electrode, and an electro-luminescent layer formed between the first electrode and the second electrode, and
- wherein the first electrode, the electro-luminescent layer, and the second electrode are overlapped each other.

9. A semiconductor device comprising:
- a first thin film integrated circuit including at least one thin film transistor, a light emitting element, a first insulating film, and an interface; and
- a second thin film integrated circuit including at least one thin film transistor, a light receiving element and a second insulating film, wherein the second thin film integrated circuit is attached to the first thin film integrated circuit with a resin;
- wherein the resin is formed between and in contact with the first insulating film and the second insulating film,
- wherein a first electric signal is converted to an optical signal in the light emitting element,
- wherein the optical signal is converted to a second electric signal in the light receiving element,
- wherein the light emitting element comprises a first electrode, a second electrode, and an electro-luminescent layer formed between the first electrode and the second electrode, and
- wherein the first electrode, the electro-luminescent layer, and the second electrode are overlapped each other.

10. A semiconductor device comprising:
- a first thin film integrated circuit including at least one thin film transistor, a light emitting element, an interlayer insulating film, and an interface;
- a second thin film integrated circuit including at least one thin film transistor and a light receiving element, wherein the second thin film integrated circuit is attached to the first thin film integrated circuit with a resin; and
- a metal oxide partially formed in contact with either surface of each of the first thin film integrated circuit and the second thin film integrated circuit;
- wherein a first electric signal is converted to an optical signal in the light emitting element,
- wherein the optical signal is converted to a second electric signal in the light receiving element,
- wherein the light emitting element comprises a first electrode, a second electrode, and an electro-luminescent layer formed between the first electrode and the second electrode, and
- wherein the first electrode, the electro-luminescent layer, and the second electrode are overlapped each other.

11. An electronic equipment comprising the semiconductor device according to any one of claims 1 to 10, wherein the electronic equipment is selected from the group consisting of a mobile phone, an electronic book, a personal computer, an electronic card, and a watch.

12. A semiconductor device according to any one of claims 1 and 2, wherein the signal from the thin film transistor is inputted to the light emitting element.

13. A semiconductor device according to any one of claims 1 and 2, wherein the signal from the light receiving element is inputted to the thin film transistor.

14. A semiconductor device according to any one of claims 3 to 10, wherein the first electric signal from the thin film transistor is inputted to the light emitting element.

15. A semiconductor device according to any one of claims 3 to 10, wherein the second electric signal from the light receiving element is inputted to the thin film transistor.

16. A semiconductor device according to any one of claims 1 to 10, wherein the light emitting element is an organic light emitting device.

17. A semiconductor device according to any one of claims 1 to 10, wherein the electroluminescent layer has a laminated structure.

18. A semiconductor device according to any one of claims 1 to 8, wherein the first semiconductor element has a first crystallized semiconductor layer, and wherein the second semiconductor element has a second crystallized semiconductor layer.

19. A semiconductor device according to any one of claims 1 to 8, further comprising a third semiconductor element comprising at least one thin film transistor,
- wherein the first semiconductor element, the second semiconductor element and the third semiconductor element are stacked.

20. A semiconductor device according to any one of claims 1 to 8, wherein the first semiconductor element and the second semiconductor element is one selected from the group consisting of a thin film transistor, a memory, a diode, an optoelectric converter, a resistor, a coil, a capacitor and an inductor.

21. A semiconductor device according to any one of claims 1 to 8, wherein the first semiconductor element comprises a semiconductor layer.

22. A semiconductor device according to any one of claims 1 to 8,
wherein the first semiconductor element comprises a semiconductor layer, and
wherein the electro-luminescent layer is physically separated from the semiconductor layer.

23. A semiconductor device according to claim 9 or 10 further comprising a third thin film integrated circuit,
wherein the first thin film integrated circuit, second thin film integrated circuit and the third thin film integrated circuit are stacked.

* * * * *